US012588333B2

(12) United States Patent
Huo

(10) Patent No.: US 12,588,333 B2
(45) Date of Patent: Mar. 24, 2026

(54) DISPLAY PANEL, MANUFACTURING METHOD THEREOF, AND DISPLAY APPARATUS

(71) Applicant: Tianma Advanced Display Technology Institute (Xiamen) Co., Ltd., Xiamen (CN)

(72) Inventor: Sitao Huo, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 442 days.

(21) Appl. No.: 18/469,927

(22) Filed: Sep. 19, 2023

(65) Prior Publication Data

US 2024/0006568 A1     Jan. 4, 2024

(30) Foreign Application Priority Data

Jun. 30, 2023    (CN) .......................... 202310796572.4

(51) Int. Cl.
| | |
|---|---|
| *H01L 33/58* | (2010.01) |
| *H01L 33/62* | (2010.01) |
| *H10H 20/853* | (2025.01) |
| *H10H 20/855* | (2025.01) |
| *H10H 20/857* | (2025.01) |
| *H10H 29/14* | (2025.01) |
| *H10W 90/00* | (2026.01) |

(52) U.S. Cl.
CPC ........ *H10H 20/855* (2025.01); *H10H 20/853* (2025.01); *H10H 20/857* (2025.01); *H10H 29/142* (2025.01); *H10W 90/00* (2026.01)

(58) Field of Classification Search
CPC . H10H 20/84; H01L 23/544; G02F 1/133512; G02F 1/1368
See application file for complete search history.

(56) References Cited

U.S. PATENT DOCUMENTS

2015/0179586 A1*  6/2015  Youk ..................... H01L 23/544
                                                                427/58

FOREIGN PATENT DOCUMENTS

| CN | 114649314 A | * | 6/2022 | ......... H01L 25/0753 |
| CN | 115602778 A |   | 1/2023 | |
| CN | 117012772 A | * | 11/2023 | ........... H10H 20/855 |

* cited by examiner

*Primary Examiner* — Joseph L Williams
(74) *Attorney, Agent, or Firm* — CHRISTENSEN O'CONNOR JOHNSON KINDNESS PLLC

(57) ABSTRACT

A display panel including an array layer and first light-emitting elements located in a first display region. The first light-emitting elements are electrically connected to the array layer. The display panel further includes a light-shielding layer and a protective layer, where one of the light-shielding layers and the protective layer contains a hydrophilic material and the other contains a hydrophobic material. The light-shielding layer includes a first light-shielding portion, which is located on a surface of the array layer facing the first light-emitting elements and between adjacent first light-emitting elements. The first light-emitting element includes a first surface away from the array layer. The protective layer includes first protective portions each located in at least a partial region of the first surface.

20 Claims, 20 Drawing Sheets

100

A-A

100

200

DISPLAY PANEL, MANUFACTURING METHOD THEREOF, AND DISPLAY APPARATUS

CROSS REFERENCE

The present disclosure claims priority to Chinese Patent Application No. 20231076572.4, filed on Jun. 30, 2023, and titled "DISPLAY PANEL, MANUFACTURING METHOD THEREOF, AND DISPLAY APPARATUS", the contents of which are incorporated herein by reference in its entirety.

TECHNICAL FIELD

The present disclosure relates to the technical field of display, and in particular, to a display panel, a manufacturing method thereof, and a display apparatus.

BACKGROUND

From the era of cathode ray tube (CRT) to liquid crystal display (LCD), and now to the emerging era of organic light-emitting diode (OLED) and light-emitting diode (LED) displays, the display industry has undergone decades of development and change. The display industry is closely related to our daily lives. From traditional mobile phones, tablets, televisions, and personal computers (PCs) to the current smart wearable devices, virtual reality (VR), and automotive displays, all electronic devices rely on display technology.

At present, how to improve the anti-reflection performance and luminous flux of display panels has become one of the urgent technical issues to be solved.

SUMMARY

In view of this, the present disclosure provides a display panel, a manufacturing method thereof, and a display apparatus, to improve the anti-reflection performance and luminous flux of display products.

According to a first aspect, the present disclosure provides a display panel, including a first display region.

The display panel further includes an array layer and first light-emitting elements located in the first display region, where the first light-emitting elements are electrically connected to the array layer.

The display panel further includes a light-shielding layer and a protective layer, where one of the light-shielding layers and the protective layer contains a hydrophilic material and the other contains a hydrophobic material. The light-shielding layer includes a first light-shielding portion, which is located on a surface of the array layer facing the first light-emitting elements and between adjacent two of the first light-emitting elements.

The first light-emitting element includes a first surface facing away from the array layer, and the protective layer includes first protective portions each located in at least a partial region of the first surface.

According to a second aspect, the present disclosure provides a display apparatus, including a display panel, and the display panel further includes an array layer and first light-emitting elements located in the first display region, where the first light-emitting elements are electrically connected to the array layer. The display panel further includes a light-shielding layer and a protective layer, where one of the light-shielding layers and the protective layer contains a hydrophilic material and the other contains a hydrophobic material. The light-shielding layer includes a first light-shielding portion, which is located on a surface of the array layer facing the first light-emitting elements and between adjacent two of the first light-emitting elements. The first light-emitting element includes a first surface facing away from the array layer, and the protective layer includes first protective portions each located in at least a partial region of the first surface.

BRIEF DESCRIPTION OF DRAWINGS

The accompanying drawings, which are incorporated in and constitute a part of the specification, illustrate embodiments of the present disclosure and together with the description, serve to explain the principles of the present disclosure.

DESCRIPTION OF EMBODIMENTS

Figure 1:
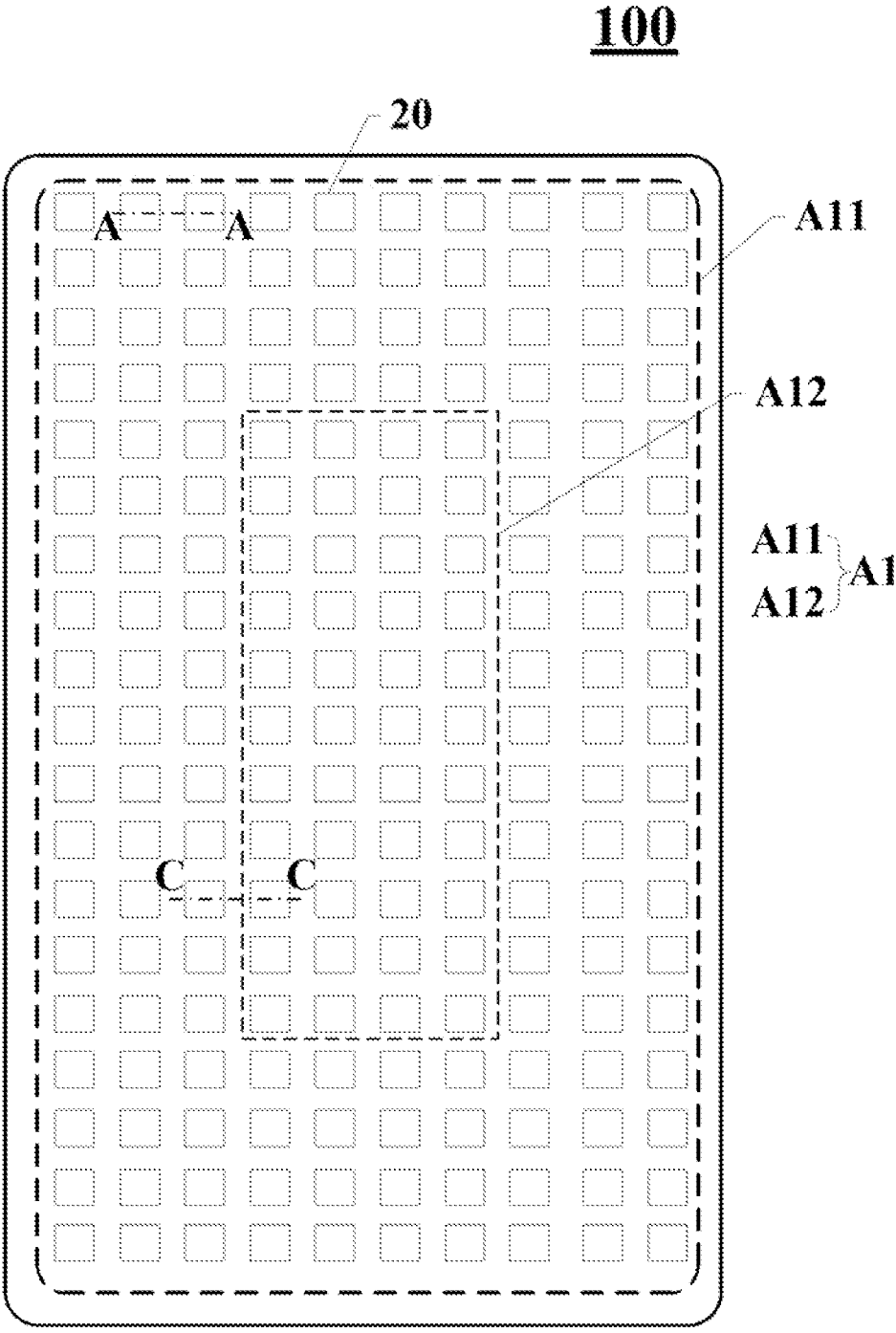
FIG. 1 is a schematic structural diagram of a display panel according to an embodiment of the present disclosure.

The exemplary embodiments of the present disclosure are described below with reference to the drawings. It should be noted that unless otherwise specified, the relative arrangement, numerical expressions, and numerical values of components and steps set forth in these embodiments do not limit the scope of the present disclosure.

The following description of at least one exemplary example is merely illustrative, and not intended to limit the present disclosure and application or use thereof in any way.

The technologies, methods, and devices known to those of ordinary skill in the art may not be discussed in detail, but where appropriate, the technologies, methods, and devices should be regarded as part of the specification.

In all examples shown and discussed herein, any specific value should be interpreted as merely exemplary, rather than restrictive. Therefore, other examples of embodiments may have different values.

It should be noted that similar reference numerals and letters represent similar items in the drawings below. Therefore, once an item is defined in one drawing, it does not need to be further discussed in subsequent drawings.

The inventors have discovered that in order to improve the anti-reflection performance of the LED display panel, a black light-absorbing material is introduced on at least a portion of the surface of the display panel. However, during the process of manufacturing the black light-absorbing material, it may spread to a forward emission surface of a light-emitting element, affecting the light pattern and overall luminous efficiency of the light-emitting element.

To solve the aforementioned technical problem, the present disclosure provides a display panel, a manufacturing method thereof, and a display apparatus. The technical solutions in the embodiments of the present disclosure will be clearly and completely described below in combination with the accompanying drawings in the embodiments of the present disclosure. All other embodiments obtained by persons of ordinary skill in the art based on the embodiments of the present disclosure without creative efforts shall fall within the protection scope of the embodiments of the present disclosure.

Figure 2:
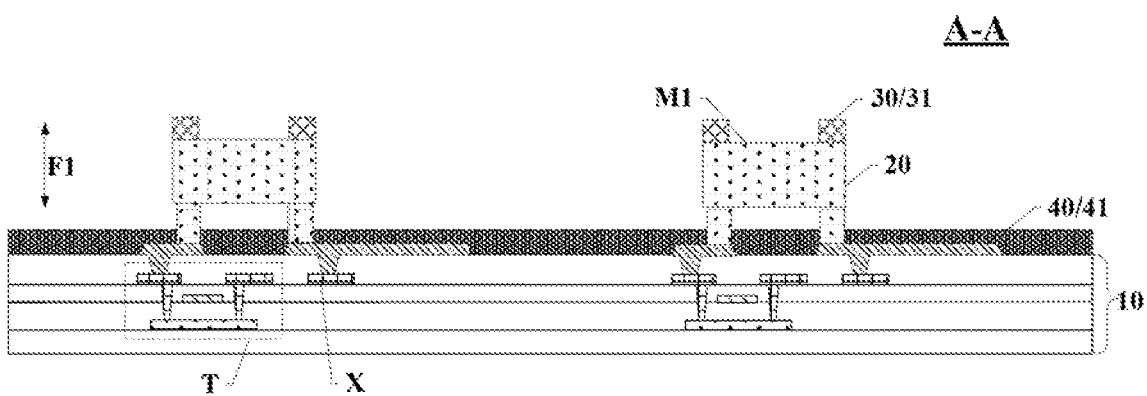
FIG. 2 is cross-sectional view of the display panel taken along AA in FIG. 1.

FIG. 1 is a schematic structural diagram of a display panel according to an embodiment of the present disclosure; and FIG. 2 is a cross-sectional view of the display panel taken along AA in FIG. 1. It should be noted that FIG. 1 is only an example illustrating a display panel 100 with a rounded rectangular structure. However, the shape of the display panel is not limited. In other embodiments of the present disclosure, the display panel may also have non-rectangular shapes such as circular, elliptical, or other irregular structures. In FIG. 1 shows an example where a top-view shape of the first light-emitting element included in the display panel is rectangular. However, the actual shape of the first light-emitting element 20 is not limited. FIG. 2 is only a schematic cross-sectional view of the display panel, primarily illustrating a relative positional shape between a light-shielding layer and a protective layer. It does not limit the actual number of film layers or the dimensions of the film layers in the display panel.

Referring to FIG. 1, a display panel 100 provided by an embodiment of the present disclosure includes a first display region A1. FIG. 1 shows an example where the display panel includes only the first display region A1. However, in other embodiments of the present disclosure, the display panel may include other display regions in addition to the first display region A1, which will be explained in subsequent embodiments.

Referring to FIG. 2, the display panel further includes an array layer 10 and first light-emitting elements 20 located in the first display region A1. The first light-emitting elements 20 are electrically connected to the array layer 10. FIG. 2 illustrates a relative positional relationship between the array layer 10 and the first light-emitting elements 20 but does not limit the actual film layer structure or the number of film layers in the array layer 10.

The display panel further includes a light-shielding layer 40 and a protective layer 30. One of the light-shielding layer 40 and the protective layer 30 includes a hydrophilic material, and the other includes a hydrophobic material. The light-shielding layer 40 includes a first light-shielding portion 41. The first light-shielding portion 41 is located on a surface of the array layer 10 facing the first light-emitting elements 20, and between adjacent first light-emitting elements 20.

The first light-emitting element 20 includes a first surface M1 facing away from the array layer 10, and the protective layer 30 includes first protective portions 31 each located in at least a partial region of the first surface M1.

In an embodiment, in the display panel provided by this embodiment of the present disclosure, the first light-emitting element 20 is a micro LED or a mini LED. During the actual fabrication process, the first light-emitting elements 20 can be transferred to a surface at one side of the array layer 10 using a massive transfer method and electrically connected to the array layer 10. In an embodiment, the array layer 10 includes drive transistors T and fixed voltage signal lines X. Two electrodes of the first light-emitting element 20 are electrically connected to the drive transistor T and the fixed voltage signal line X respectively. The first light-emitting element 20 emits light under the influence of electrical signals provided by the drive transistor T and the fixed voltage signal line X.

Further in reference to FIG. 1 and FIG. 2, the display panel provided by this embodiment of the present disclosure includes the array layer 10, and the first light-emitting elements 20 disposed in the first display region A1 and electrically connected to the array layer 10. Additionally, the display panel further includes the light-shielding layer 40. In an embodiment, the light-shielding layer 40 includes a black light-absorbing material. The first light-shielding portion 41 in the light-shielding layer 40 is located between adjacent first light-emitting elements 20. In an embodiment, a gap between adjacent first light-emitting elements 20 is covered by the first light-shielding portion 41. As a result, when external light falls on a light exit surface of the display panel, the first light-shielding portion 41 can absorb the external light, thereby enhancing the anti-reflection performance of the display panel. This is advantageous for improving the display effect of the display panel under strong illumination.

The inventors discovered that during preparation of the black light-absorbing material in the display panel, for example, during printing of the black light-absorbing material, the black light-absorbing material is likely to infiltrate and spread along the side surface of the light-emitting element to the top of the light-emitting element, resulting in a loss of light efficiency and a change in light emission pattern of the light-emitting element. To address this issue, the present disclosure introduces the protective layer 30 in the display panel. In an embodiment, the transmittance of the protective layer 30 is higher than that of the light-shielding layer 40. In an embodiment, the protective layer 30 can be a transparent protective layer 30 with a transmittance of 95% or higher. When the light-shielding layer 40 is made of a hydrophilic material, the introduced protective layer 30 is made of a hydrophobic material. When the light-shielding layer 40 is made of a hydrophobic material, the introduced protective layer 30 is made of a hydrophilic material. In other words, the wettability properties of the protective layer 30 and the light-shielding layer 40 are mutually repellent. The first protective portions 31 in the protective layer 30 are each located in at least a partial region of the first surface M1 of the first light-emitting element 20 that faces away from the array layer 10. In the manufacturing process of the display panel, after the first light-emitting elements 20 are transferred to a surface at one side of the array layer 10 and are electrically connected to the array layer 10, the protective layer 30 can be first formed. The first surface M1 of the first light-emitting element 20 is protected using the first protective portion 31 in the protective layer 30. Then, the light-shielding layer 40 is fabricated. During the process of forming the light-shielding layer 40, due to the protective effect of the first protective portion 31 and the repellent wettability properties of the first protective portion 31 and the light-shielding layer 40, the light-shielding layer 40 cannot spread towards the first surface M1 of the first light-emitting element 20. This prevents the light-shielding layer 40 from affecting the light emission pattern and luminous flux of the first light-emitting element 20 when the light-shielding layer 40 spreads to the first surface M1 of the first light-emitting element 20. Therefore, it is beneficial for improving the display accuracy and luminous flux of the display panel.

In an embodiment, along a first direction F1, the first protective portion 31 has a thickness smaller than or equal to 3 μm and has a transmittance of 95% or higher.

In an embodiment, the protective layer 30 is made of a hydrophobic material, which specifically can be a fluorinated organic compound. The light-shielding layer 40 is made of a hydrophilic material, which specifically can be a mixture of epoxy resin and carbon black, or a mixture of acrylic and carbon black.

It should be noted that the protective layer 30 mentioned in this embodiment of the present disclosure can be an additional layer fabricated on top of the first light-emitting element 20, or a modified layer derived from an existing layer of the first light-emitting element 20. Depending on the material characteristics of the light-shielding layer 40, appropriate modifications can be made to the first light-emitting element 20, as long as the surface or side of the first light-emitting element 20 after the modification is repellant to the light-shielding layer 40. The term "modification" here is not limited to hydrophobic or hydrophilic treatments applied to the first light-emitting element 20. For example, if the light-shielding layer 40 has hydrophilic properties, to avoid the impact of the light-shielding layer 40 on the forward emission of the first light-emitting element 20, modification such as hydrophobic treatment can be performed on an inherent film layer on the first surface of the first light-emitting element 20, such that the inherent film layer on the first surface of the first light-emitting element 20 becomes hydrophobic. This inherent film layer can then be reused as the aforementioned protective layer, eliminating the need to additionally manufacture a protective layer on the first light-emitting element 20.

Figure 3:
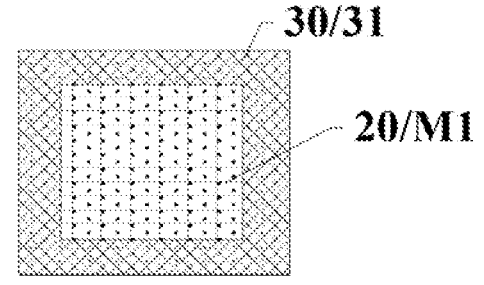
FIG. 3 is a top view of a first light-emitting element in FIG. 1 and a first protective portion corresponding to the first light-emitting element.
Figure 4:
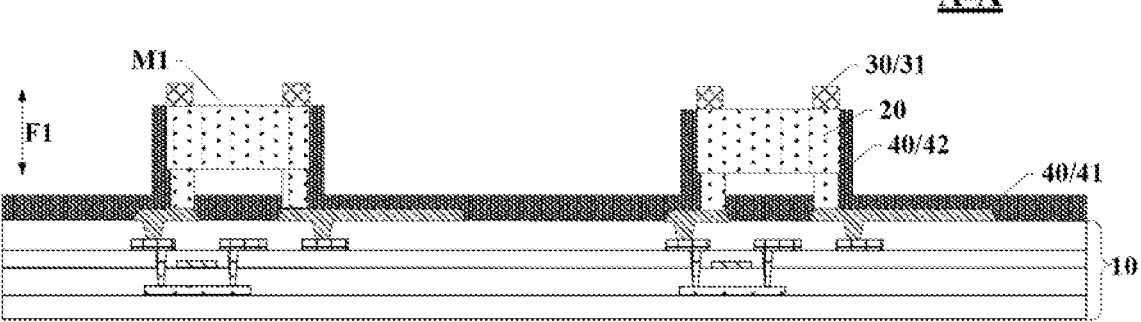
FIG. 4 shows a relative positional relationship between a light-shielding layer and a first protective portion on the first light-emitting element.

FIG. 2 is cross-sectional view of the display panel taken along AA in FIG. 1; FIG. 3 is a top view of a first light-emitting element 20 in FIG. 1 and a first protective portion 31 corresponding to the first light-emitting element 20; and FIG. 4 shows a relative positional relationship between a light-shielding layer 40 and a first protective portion 31 on the first light-emitting element 20. In this embodiment, the top-view structure of the first light-emitting element 20 being rectangular is taken as an example for description, but the actual top-view shape of the first light-emitting element 20 is not limited.

Referring to FIG. 3, in an optional implementation of the present disclosure, the first protective portion 31 is located at the edge of the first surface M1, and the first protective portion 31 forms a closed ring structure along the edge of the first surface M1.

Specifically, this embodiment illustrates an approach where the first protective portion 31 is only located in a partial area of the first surface M1. When the first protective portion 31 is located only in a partial area of the first surface M1, the first protective portion 31 can take the form of a closed ring structure distributed along the edge of the first surface M1. The first protective portion 31 can be considered as a ring-shaped barrier structure formed on the first surface M1 of the first light-emitting element 20. Referring to FIG. 4, during the process of forming the light-shielding layer 40, even when the light-shielding layer 40 infiltrates and diffuses along the side surface of the first light-emitting element 20, the first light-shielding portion 41, which is arranged at the edge of the first surface M1 of the first light-emitting element 20 to act as a barrier, can effectively prevent the infiltration and diffusion of the light-shielding layer 40 towards the first surface M1 of the first light-emitting element 20, thereby effectively preventing the light-shielding layer 40 from blocking the first surface M1 of the first light-emitting element 20. Additionally, when the first protective portion 31 is only arranged at the edge region of the first surface M1, the first protective portion 31 does not cover the central region of the first light-emitting element 20. This helps to ensure the forward luminous flux of the first light-emitting element 20.

Figure 5:
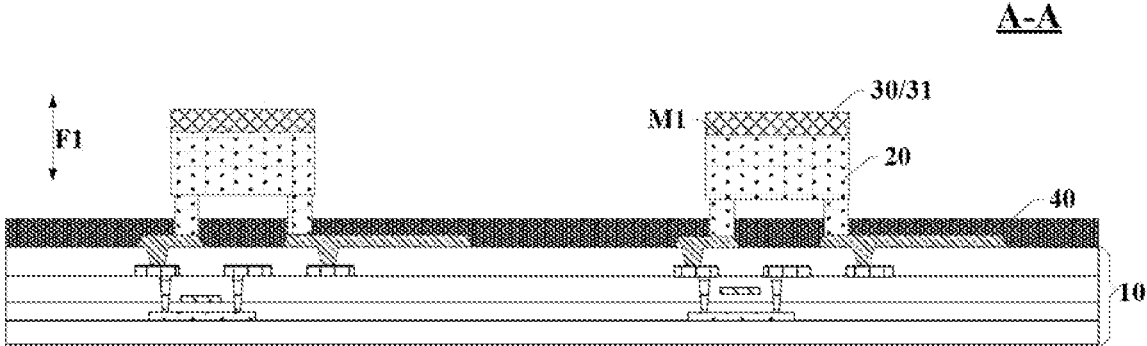
FIG. 5 is another cross-sectional view of the display panel taken along AA in FIG. 1.
Figure 6:
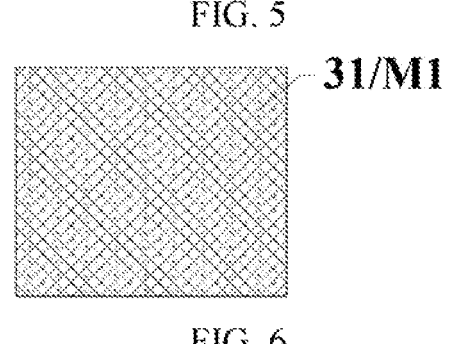
FIG. 6 is another top view of a first light-emitting element in FIG. 1 and a first protective portion corresponding to the first light-emitting element.

FIG. 5 is another cross-sectional view of the display panel taken along AA in FIG. 1; FIG. 6 is another top view of a first light-emitting element 20 in FIG. 1 and a first protective portion 31 corresponding to the first light-emitting element 20. The difference from FIG. 2 and FIG. 3 lies in that the first protective portion 31 covers a different area on the first surface M1 of the first light-emitting element 20.

Referring to FIG. 5 and FIG. 6, in an optional implementation of the present disclosure, the first protective portion 31 is located on the entire first surface M1 of the first light-emitting element 20.

Specifically, this embodiment illustrates an approach where the first protective portion 31 covers the first surface M1 of the first light-emitting element 20. In this case, there is no need for patterned design of the first protective portion 31 on the first surface M1 of the first light-emitting element 20. This helps to simplify the manufacturing process of the first protective portion 31. Furthermore, when the entire first surface M1 of the first light-emitting element 20 is covered by the first protective portion 31, the light-shielding layer 40 will not appear in the region with the first protective portion 31. This effectively provides all-around protection to the first surface M1 of the first light-emitting element 20, which further helps to prevent the diffusion of the light-shielding layer 40 onto the first surface M1 of the first light-emitting element 20. Therefore, this approach further helps to avoid the impact of the light-shielding layer 40 on the light pattern and luminous flux of the first light-emitting element 20.

Figure 7:
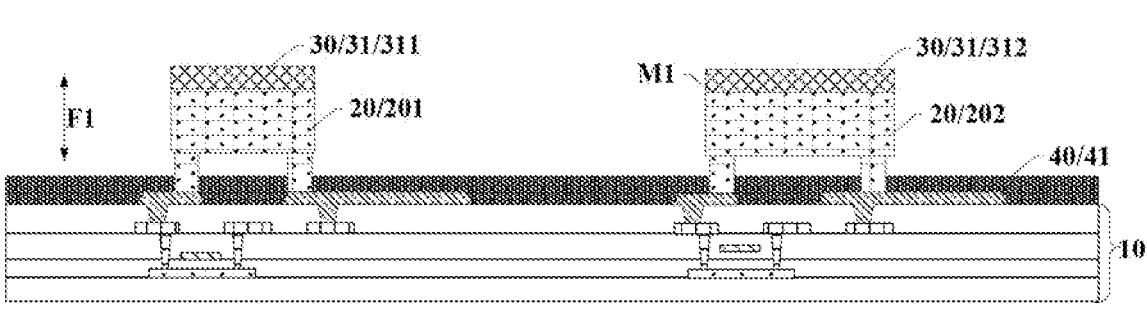
FIG. 7 is another cross-sectional view of the display panel taken along AA in FIG. 1.
Figure 8:
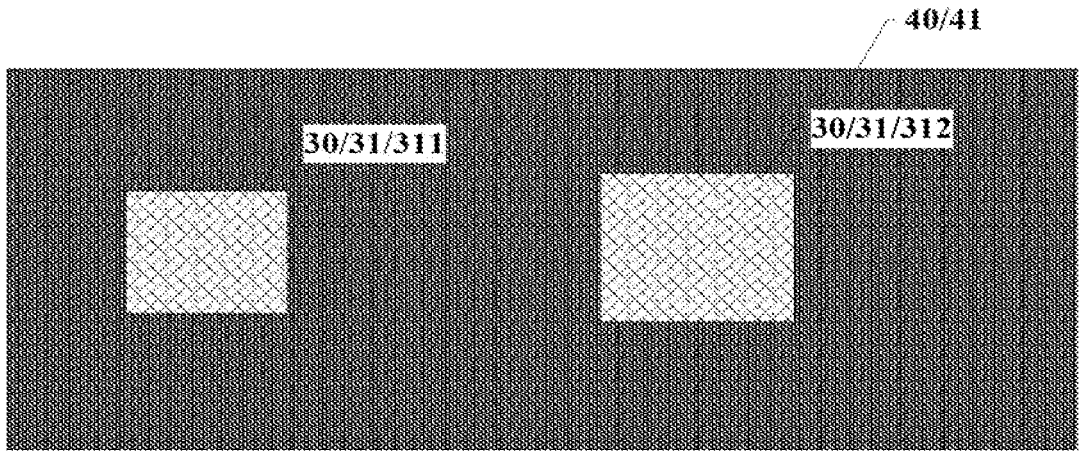
FIG. 8 is a top view of two first light-emitting elements in FIG. 1, first protective portions corresponding to the first light-emitting elements, and a light-shielding layer.

FIG. 7 is another cross-sectional view of the display panel taken along AA in FIG. 1; FIG. 8 is a top view of two first light-emitting elements 20 in FIG. 1, first protective portions 31 corresponding to the first light-emitting elements 20, and a light-shielding layer 40. Referring to FIG. 7 and FIG. 8, in an optional implementation of the present disclosure, the first light-emitting elements 20 include a first color light-emitting element 201 and a second color light-emitting element 202. An emission wavelength of the first color light-emitting element 201 is smaller than that of the second color light-emitting element 202. The first protective portion 31 includes a first protective sub-portion 311 corresponding to the first color light-emitting element 201, and a second protective sub-portion 312 corresponding to the second color light-emitting element 202. The first protective sub-portion 311 has an orthographic projection area of S1 along a first direction F1, and the second protective sub-portion 312 has an orthographic projection area of S2 along the first direction F1, where S2>S1. The first direction F1 is perpendicular to a plane of the display panel. In an embodiment, the second color light-emitting element 202 is a red light-emitting element, while the first color light-emitting element 201 is either a blue light-emitting element or a green light-emitting element.

This embodiment illustrates a design approach where the areas of the first protective portions 31 corresponding to light-emitting elements with different emission colors are differentiated. Specifically, in this embodiment, the emission wavelength of the first color light-emitting element 201 is smaller than that of the second color light-emitting element 202. Correspondingly, luminous efficiency of the first color light-emitting element 201 is higher than that of the second color light-emitting element 202. In an embodiment, the size of the second color light-emitting element 202 is larger than that of the first color light-emitting element 201. Specifically, the area of the first surface M1 of the second color light-emitting element 202 is larger than the area of the first surface M1 of the first color light-emitting element 201. Designing the sizes of the second color light-emitting element 202 and the first color light-emitting element 201 to be different helps to increase the luminous flux of the second color light-emitting element 202, which has lower luminous efficiency. Furthermore, in this embodiment of the present disclosure, the first protective portion 31 on the first surface M1 of the first color light-emitting element 201 and the first protective portion 31 on the first surface M1 of the second color light-emitting element 202 are designed to be different. Assuming that the first protective portion 31 corresponding to the first color light-emitting element 201 is the first protective sub-portion 311 with an area of S1, and the first protective portion 31 corresponding to the second color light-emitting element 202 is the second protective sub-portion 312 with an area of S2, it is specified in the present disclosure that S2>S1, increasing the size of the second protective sub-portion 312 on the second color light-emitting element 202, which has lower luminous efficiency and a larger size. This helps to enhance the protective capability of the second protective sub-portion 312 for the second color light-emitting element 202, thereby preventing the light-shielding layer 40 from spreading onto the first surface M1 of the second color light-emitting element 202 to affect the forward luminous efficiency of the second color light-emitting element 202.

Figure 9:
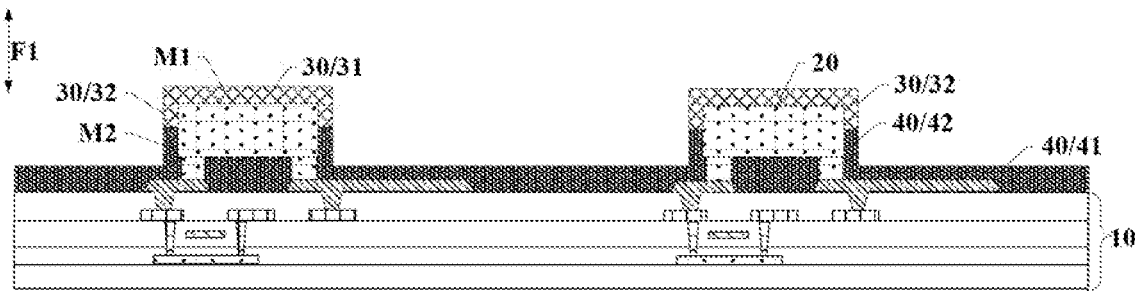
FIG. 9 is another cross-sectional view of the display panel taken along AA in FIG. 1.

FIG. 9 is another cross-sectional view of the display panel taken along AA in FIG. 1. This embodiment illustrates another relative positional relationship between the protective layer 30 and the first light-emitting element 20.

Referring to FIG. 9, in an optional implementation of the present disclosure, the protective layer 30 further includes second protective portions 32. The first light-emitting element 20 further includes a first side surface M2 in contact with the first surface M1. The second protective portion 32 is located on the first side surface M2.

Specifically, this embodiment illustrates an approach where the protective layer 30 further includes second protective portions 32 each arranged on the first side surface M2 of the first light-emitting element 20. When the second protective portion 32 is arranged on the first side surface M2 of the first light-emitting element 20, during the manufacturing process of the light-shielding layer 40, as the light-shielding layer 40 infiltrates and diffuses along the side surface of the first light-emitting element 20 and reaches the position of the second protective portion 32 located on the first side surface M2, the light-shielding layer 40 will be unable to further spread upwards due to the repellent wettability properties of the second protective portion 32 and the light-shielding layer 40. In other words, the region on the first side surface M2 of the first light-emitting element 20 where the second protective portion 32 is placed will remain uncovered by the light-shielding layer 40. When the first light-emitting element 20 emits light, most of the light exits from the first surface M1, and a portion of the light will exit from the region covered by the second protective portion 32 on the first side surface M2. Therefore, the second protective portion 32 helps to increase the lateral luminous flux of the first light-emitting element 20, thereby improving the overall luminous flux of the first light-emitting element 20, which in turn enhances the overall display brightness of the display panel.

In an embodiment, when the second protective portion 32 is introduced onto the first side surface M2 of the first light-emitting element 20, the second protective portion 32 can be integrally formed with the first protective portion 31. In other words, the second protective portion 32 and the first protective portion 31 are manufactured in the same production process. It is unnecessary to introduce different manufacturing steps for the second protective portion 32 and the first protective portion 31, thereby reducing the complexity of fabricating the protective layer 30, which in turn enhances the overall production efficiency of the display panel.

Figure 10:
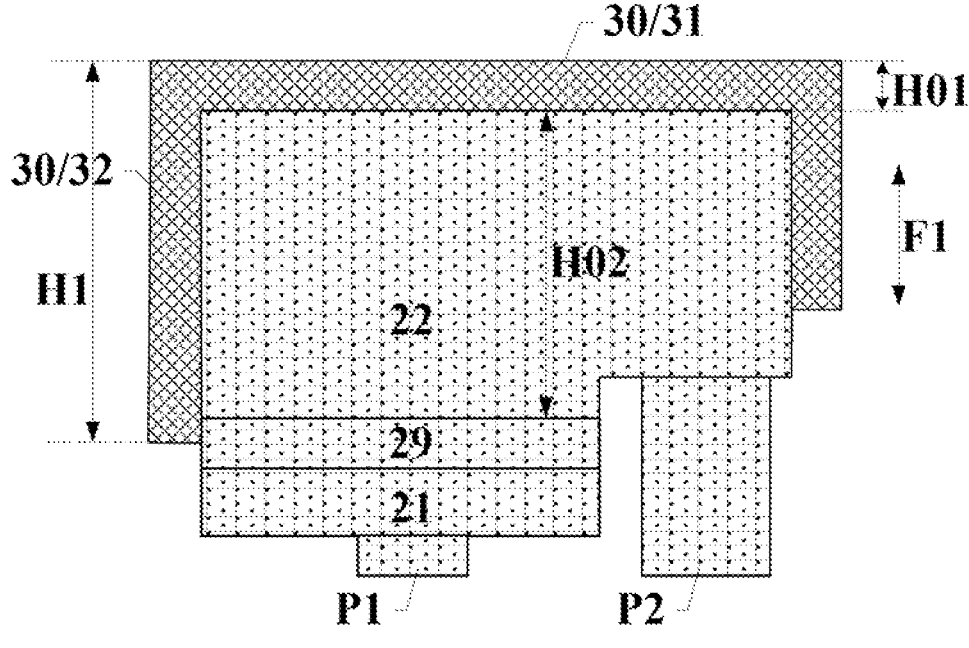
FIG. 10 is a detailed structural diagram of a first light-emitting element and a protective layer according to an embodiment of the present disclosure.

FIG. 10 is a detailed structural diagram of a first light-emitting element 20 and a protective layer 30 according to an embodiment of the present disclosure. This embodiment illustrates details of a film layer structure corresponding to the first light-emitting element 20. It should be noted that the structure of the first light-emitting element 20 shown in FIG. 10 is for the illustrative purpose only but does not limit the actual structure of the first light-emitting element 20.

Referring to FIG. 10, in an optional implementation of the present disclosure, the first light-emitting element 20 includes a first electrode P1, a second electrode P2, as well as a first contact layer 21, a light-emitting layer 29, and a second contact layer 22 that are sequentially laminated. Along the first direction F1, the light-emitting layer 29 is located between the first contact layer 21 and the second contact layer 22. The first electrode P1 is electrically connected to the first contact layer 21, and the second electrode P2 is electrically connected to the second contact layer 22. The first electrode P1 and the second electrode P2 are located at a side of the light-emitting layer 29 adjacent to the array layer 10. The first direction F1 is perpendicular to the plane of the display panel. Along the first direction F1, the second protective portion 32 has a height of H1, the first protective portion 31 has a height of H01, and the second contact layer 22 has a height of H02, where $H1 \geq H01+H02$. Optionally, $H1 \leq 5 \ \mu m$.

Further in reference to FIG. 10, in an embodiment, the first contact layer 21 is a first-type semiconductor layer, and the second contact layer 22 is a second-type semiconductor layer. The light-emitting layer 29 is an active layer. The first-type semiconductor is N-type semiconductor N—GaN, and the second-type semiconductor is P-type semiconductor P—GaN. Alternatively, the first-type semiconductor is P-type semiconductor P—GaN, and the second-type semiconductor is N-type semiconductor N—GaN. In this embodiment, description is made by using an example where the first-type semiconductor layer corresponding to the first contact layer 21 is an N-type semiconductor layer and the second-type semiconductor corresponding to the second contact layer 22 is a P-type semiconductor.

When the second protective portion 32 is arranged on the first side surface M2 of the first light-emitting element 20, the present disclosure specifies that the height H1 of the second protective portion 32 along the first direction F1 is greater than or equal to a sum of the height H01 of the first protective portion 31 and the height H02 of the second contact layer 22. In this case, the second protective portion 32 extends at least to the side surface of the light-emitting layer 29. The embodiment shown in FIG. 10 shows the configuration where the second protective portion 32 extends to a partial side surface of the light-emitting layer 29. This is advantageous in increasing the coverage area of the second protective portion 32 on the side surface of the first light-emitting element 20, to reduce the area of the light-emitting layer 29 that could be covered by the light-shielding layer 40, thereby enhancing the lateral luminous flux of the first light-emitting element 20.

Figure 11:
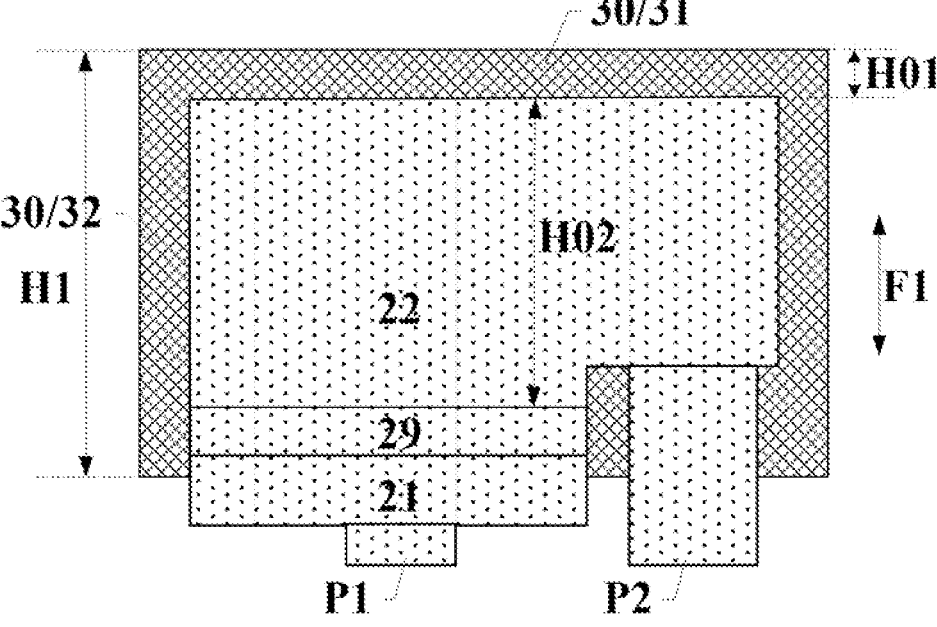
FIG. 11 is another detailed structural diagram of a first light-emitting element and a protective layer according to an embodiment of the present disclosure.

FIG. 11 is another detailed structural diagram of a first light-emitting element 20 and a protective layer 30 according to an embodiment of the present disclosure, which differs from FIG. 10 in that the second protective portion 32 extends to a side of the light-emitting layer 29 facing towards the first contact layer 21, to cover the entire side surface of the light-emitting layer 29, and further extends to at least a partial side surface of the first contact layer 21. In the first light-emitting element 20, the actual film layer responsible for emitting light is the light-emitting layer 29. Most of the light emitted by the light-emitting layer 29 exits through the first surface M1 of the first light-emitting element 20. Additionally, a portion of the light will exit through lateral sides of the light-emitting layer 29 and the second contact layer 22. When the second protective portion 32 is extended to the side surface of the light-emitting layer 29, the light-shielding layer 40 will not be able to infiltrate to the side surface of the light-emitting layer 29. Under the protection of the second protective portion 32, the light emitted from the lateral side of the light-emitting layer 29 will remain unaffected by the light-shielding layer 40. Therefore, this approach is advantageous in enhancing the overall luminous flux of the first light-emitting element 20.

Figure 12:
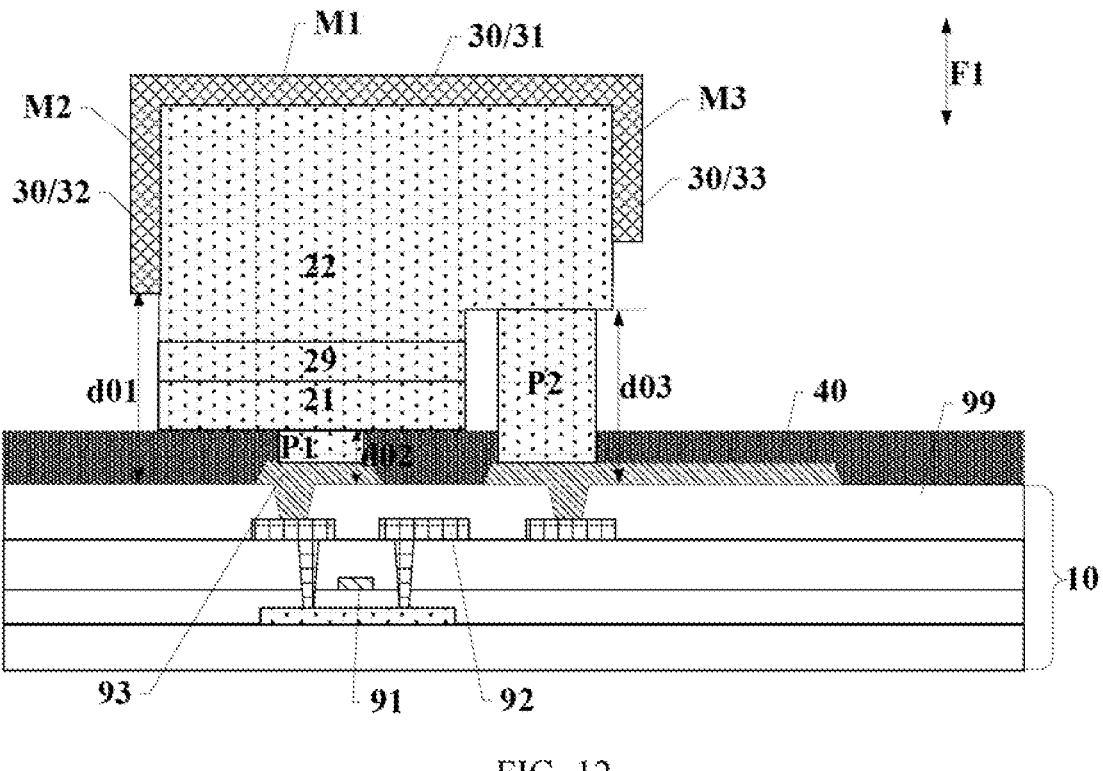
FIG. 12 is a diagram showing a relative positional relationship between a first light-emitting element and an array layer.

FIG. 12 is a diagram showing a relative positional relationship between a first light-emitting element 20 and an array layer 10. Referring to FIG. 12, in an optional implementation of the present disclosure, along the first direction F1, a minimum distance d01 between the second protective portion 32 and the array layer 10 is greater than a maximum distance between the first electrode P1 or second electrode P2 and the array layer 10.

In an embodiment, the array layer 10 includes a first metal layer 91, a second metal layer 92, and a third metal layer 93 that are sequentially laminated. The metal layers are isolated by insulating layers. Along the first direction F1, the second metal layer 92 is located between the first metal layer 91 and the third metal layer 93. The third metal layer 93 is located at a side of the second metal layer 92 that faces the first light-emitting element 20. The insulating layer isolating the second metal layer 93 and the third metal layer 93 is a flat layer 99.

In this embodiment shows an alternative implementation of the second protective portion 32 on the first side surface M2 of the first light-emitting element 20. In this embodiment, the minimum distance between the second protective portion 32 and the array layer 10 refers to a distance d01 between the surface of the second protective portion 32 facing the array layer 10 and the surface, which faces the second protective portion 32, of the flat layer 99 within the array layer 10. The maximum distance between the first electrode P1 and the array layer 10 refers to a distance d02 between the surface of the first electrode P1 away from the array layer 10 and the surface, which faces the first electrode P1, of the flat layer 99 within the array layer 10. The maximum distance between the second electrode P2 and the array layer 10 refers to a distance d03 between the surface of the second electrode P2 away from the array layer 10 and the surface, which faces the second electrode P2, of the flat layer 99 within the array layer 10. In this embodiment, it is specified that d01>d02 and d01>d03. In this way, the second protective portion 32 will not cover the side surfaces of the first electrode P1 and the second electrode P2. During the manufacturing process of the light-shielding layer 40, during infiltration and diffusion along the side surface of the light-emitting element, the light-shielding layer 40 will be able to diffuse to the side surfaces of the first electrode P1 and the second electrode P2, covering at least partial regions of the first electrode P1 and the second electrode P2. Since the first electrode P1 and the second electrode P2 are made of conductive metal materials and have a certain level of reflectivity, when the light-shielding layer 40 covers the first electrode P1 and the second electrode P2, it helps to prevent light from being reflected at the positions of the first electrode P1 and the second electrode P2, which could otherwise affect the display quality. This contributes to enhancing the anti-reflection performance of the display panel, thereby improving the effect of the display panel when used in environments with strong light. Additionally, since the first electrode P1 and the second electrode P2 are made of conductive metal materials, when the protective layer 30 extends to the side surfaces of the first electrode P1 and the second electrode P2, the conductivity of the first electrode P1 and the second electrode P2 may be affected. In this embodiment, it is specified that d01>d02 and d01>d03. In this way, the second protective portion 32 will not cover the side surfaces of the first electrode P1 and the second electrode P2. This helps to prevent the second protective portion 32 from affecting the conductivity of the first electrode P1 and the second electrode P2, thereby enhancing the reliability of conductivity of the first electrode P1 and the second electrode P2.

Figure 13:
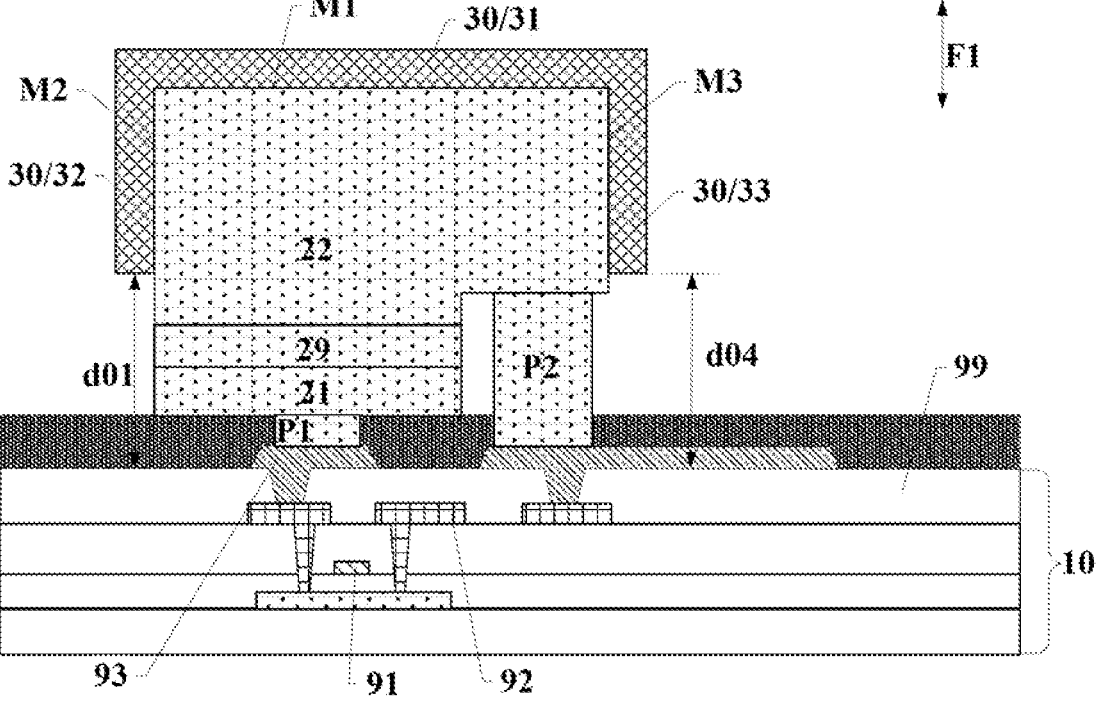
FIG. 13 is a diagram showing another relative positional relationship between a first light-emitting element and an array layer.

FIG. 13 is a diagram showing another relative positional relationship between a first light-emitting element and an array layer. Referring to FIG. 13, in an optional implementation of the present disclosure, the protective layer 30 further includes third protective portions 33. The first light-emitting element 20 further includes a second side surface M3 opposite to the first side surface M2. The third protective portion 33 is located on the second side surface M3. Along the first direction F1, a minimum distance between the second protective portion 32 and the array layer 10 is equal to a minimum distance between the third protective portion 33 and the array layer 10.

Further referring to FIG. 12, it is assumed that in the side surfaces of the first light-emitting element 20, the side surface adjacent to the first electrode P1 is referred to as the first side surface M2, and the side surface adjacent to the second electrode P2 is referred to as the second side surface M3. The first side surface M2 is opposite to the second side surface M3. The second protective portion 32 is located on the first side surface M2, while the third protective portion 33 is located on the second side surface M3. The minimum distance between the second protective portion 32 and the array layer 10 refers to a distance d01 between the surface of the second protective portion 32 facing the array layer 10 and the surface, which faces the second protective portion 32, of the flat layer 99 within the array layer 10. The minimum distance between the third protective portion 33 and the array layer 10 refers to a distance d04 between the surface of the third protective portion 33 facing the array layer 10 and the surface, which faces the third protective portion 33, of the flat layer 99 within the array layer 10. In this embodiment, it is specified that d04=d01, such that the surfaces, which face the array layer 10, of the first protective portion 31 and the second protective portion 32 are flush with each other. In this way, during the formation of the protective layer 30, the first light-emitting element 20 can be inverted and immersed in a container containing a transparent hydrophilic or hydrophobic material, such that the first surface M1 and at least a partial side surface of the first light-emitting element 20 are submerged in the material. Upon curing, the first protective portion 31, the second protective portion 32, and the third protective portion 33 within the protective layer 30 are formed. It is unnecessary to introduce different manufacturing processes for the protective layer 30 at different positions. This forming method of the protective layer 30 is relatively simple and easy to operate. It is beneficial for simplifying the overall manufacturing process of the display panel, thereby improving production efficiency.

FIG. 12 illustrates an approach where the minimum distances from the second protective portion 32 and the third protective portion 33 to the flat layer 99 within the array layer 10 are not equal. Specifically, the distance between the second protective portion 32 and the flat layer 99 is smaller than the distance between the third protective portion 33 and the flat layer 99. In the manufacturing process of the light-shielding layer 40, when the light-shielding layer 40 infiltrates and diffuses along the first side surface M2 and the second side surface M3, the diffusion height of the light-shielding layer 40 on the second side surface M3 may be larger due to a smaller coverage by the third protective portion 33 on the second side surface M3. As a result, the lateral luminous flux from the second side surface M3 is smaller than the lateral luminous flux from the first side surface M2. For the first light-emitting elements arranged in different regions of the display panel, there may be regions requiring different lateral luminous flux. In this case, first light-emitting elements with different lateral luminous flux can be arranged in such regions, to enhance the overall display effect of the display panel.

Figure 14:
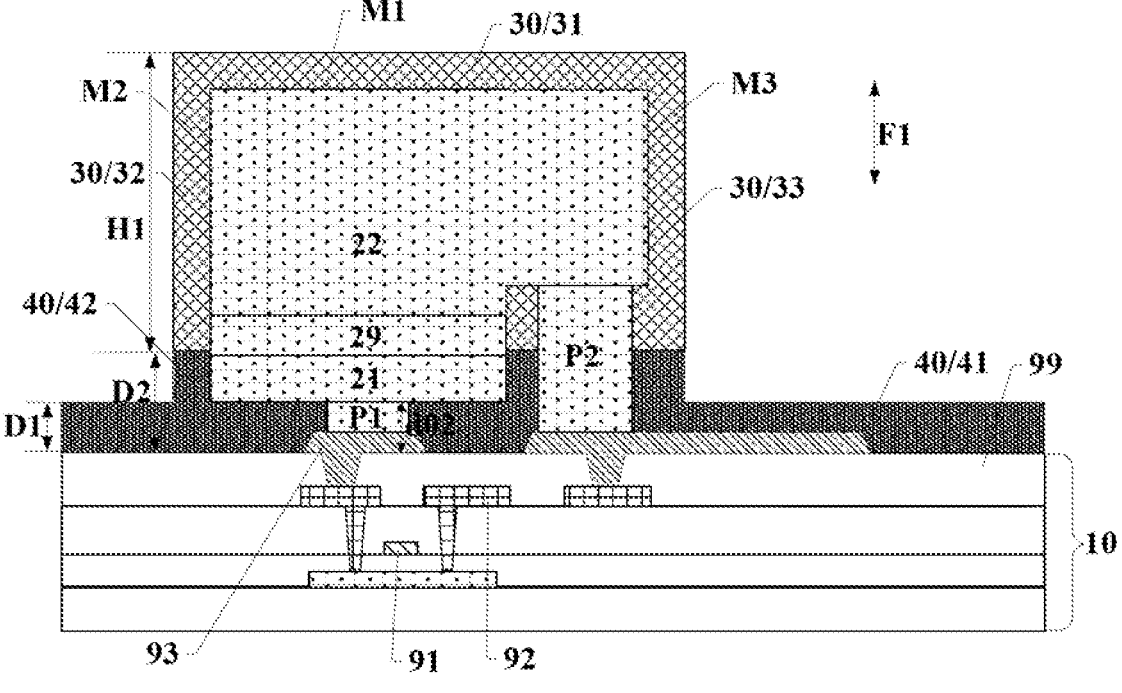
FIG. 14 is a diagram showing another relative positional relationship between a first light-emitting element and an array layer.

Referring to FIG. 9 and FIG. 14, FIG. 14 is a diagram showing another relative positional relationship between a first light-emitting element 20 and an array layer 10. In an optional implementation of the present disclosure, the light-shielding layer 40 further includes second light-shielding portions 42. The second light-shielding portion 42 is located on the first side surface M2. Along the first direction F1, the second light-shielding portion 42 is in direct contact with the second protective portion 32.

Specifically, during the actual manufacturing process of the display panel, after the first light-emitting element 20 is transferred to one side surface of the array layer 10 and electrically connected to the array layer 10, the protective layer 30 can be first formed on the first surface M1 and at least a partial side surface of the first light-emitting element 20. Subsequently, the manufacturing process for the light-shielding layer 40 can be conducted. The light-shielding layer 40 infiltrates and diffuses along the side surface of the first light-emitting element 20, forming a second light-shielding portion 42 on the side surface of the first light-emitting element 20. Due to the repellent wettability properties of the second protective portion 32 and the light-shielding layer 40, the diffusion of the second light-shielding portion 42 ceases upon reaching the position adjacent to the second protective portion 32. As a result, the second light-shielding portion 42 covers the region, which is not covered by the second protective portion 32, on the side surface of the first light-emitting element 20. This approach ensures that the luminous flux of the first light-emitting element 20 remains unaffected by the second light-shielding portion 42 while expanding the overall coverage of the light-shielding layer 40, thereby enhancing the overall anti-reflection performance of the display panel.

Further referring to FIG. 14, in an optional implementation of the present disclosure, the light-shielding layer 40 further includes second light-shielding portions 42. The second light-shielding portion 42 is located on the first side surface M2. Along the first direction F1, the second protective portion 32 has a height of H1, the first light-shielding portion 41 has a height of D1, and the second light-shielding portion 42 has a height of D2, where H1>D2≧D1. The height D1 of the first light-shielding portion 41 is a distance between the surface of the first light-shielding portion facing the flat layer 99 and the surface of the first light-shielding portion away from the flat layer 99. The height D2 of the second light-shielding portion 42 is a distance between the surface of the second light-shielding portion 42 facing the flat layer 99 and the surface of the second light-shielding portion 42 away from the flat layer 99. Likewise, the height H1 of the second protective portion 32 is a distance between the surface of the second protective portion 32 facing the flat layer 99 and the surface of the second protective portion 32 away from the flat layer 99.

Further referring to FIG. 14, in this embodiment of the present disclosure, it is specified that when the height of the second protective portion 32 is greater than the height of the second light-shielding portion 42, a larger portion of the first side surface M2 of the first light-emitting element 20 is covered by the second protective portion 32. This helps to reduce the obstruction of lateral light emission from the first light-emitting element 20 by the second light-shielding portion 42, thereby improving the lateral luminous flux from the first light-emitting element 20 and enhancing the overall luminous flux of the display panel. Furthermore, in the present disclosure, it is specified that when the height of the second light-shielding portion 42 is greater than or equal to the height of the first light-shielding portion 41, at least a portion of the region where the first light-emitting element 20 interfaces with the array layer 10 is covered by the second light-shielding portion 42. For example, at least a portion of the side surfaces of the first electrode P1 and the second electrode P2 in the first light-emitting element 20 will be covered by the second light-shielding portion 42. This helps to reduce the reflection from the first electrode P1 and the second electrode P2, thus enhancing the overall anti-refection performance of the display panel.

Figure 15:
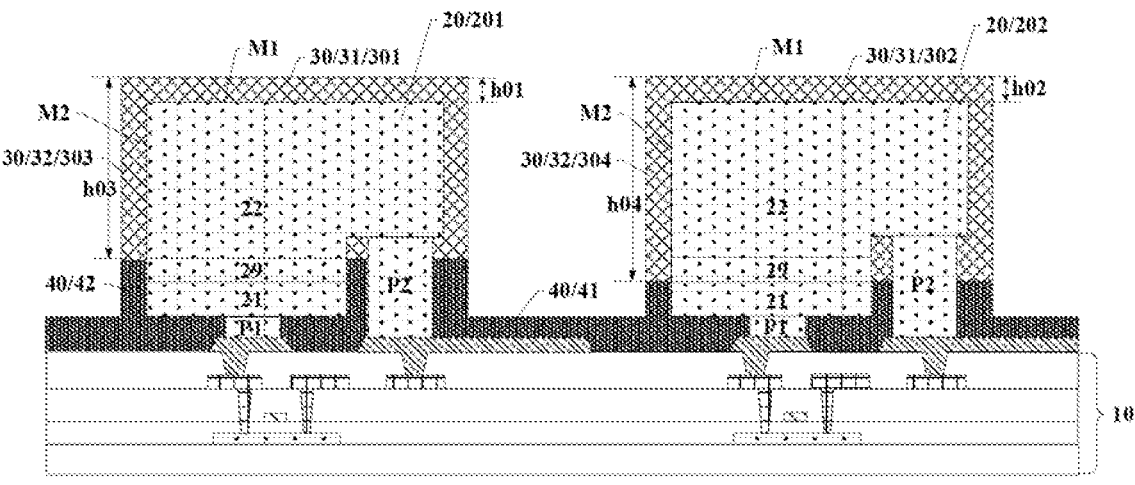
FIG. 15 is a diagram showing a relative positional relationship between a first color light-emitting element as well as a second color light-emitting element and an array layer.

FIG. 15 is a diagram showing a relative positional relationship between a first color light-emitting element 201 as well as a second color light-emitting element 202 and an array layer 10. Referring to FIG. 15, in an optional implementation of the present disclosure, the first light-emitting elements 20 include a first color light-emitting element 201 and a second color light-emitting element 202. An emission wavelength of the first color light-emitting element 201 is smaller than that of the second color light-emitting element 202. The first protective portion 31 includes a first sub-portion 301 corresponding to the first color light-emitting element 201 and a second sub-portion 302 corresponding to the second color light-emitting element 202. The second protective portion 32 includes a third sub-portion 303 corresponding to the first color light-emitting element 201 and a fourth sub-portion 304 corresponding to the second color light-emitting element 202. Along the first direction F1, the first sub-portion 301 has a height of h01, the second sub-portion 302 has a height of h02, the third sub-portion 303 has a height of h03, and the fourth sub-portion 304 has a height of h04. The first direction F1 is perpendicular to the plane of the display panel, where h03−h01<h04−h02.

Further referring to FIG. 15, in this embodiment, an approach where a distance between the first surface M1 of the first color light-emitting element 201 and the array layer 10 is the same as a distance between the first surface M1 of the second color light-emitting element 202 and the army layer 10 is taken as an example for description. In some other embodiments of the present disclosure, the distance between the first surface M1 of the first color light-emitting element 201 and the array layer 10 may be different from the distance between the first surface M1 of the second color light-emitting element 202 and the array layer 10, which will be illustrated in the subsequent embodiments.

Referring to FIG. 15, the first sub-portion 301 is located on the first surface M1 of the first color light-emitting element 201. The second sub-portion 302 is located on the first surface M1 of the second color light-emitting element 202. The third sub-portion 303 is situated on the side surface of the first color light-emitting element 201, and the fourth sub-portion 304 is located on the side surface of the second color light-emitting element 202. In an embodiment, the height h03 of the third sub-portion 303 is greater than the height h01 of the first sub-portion 301, and the height h04 of the fourth sub-portion 304 is greater than the height h02 of the second sub-portion 302. In this manner, there is a certain area covered with a protective layer on the side surfaces of both the first color light-emitting element 201 and the second color light-emitting element 202. This helps to enhance the lateral luminous flux from the first color light-emitting element 201 and the second color light-emitting element 202. In this embodiment, the emission wavelength of the first color light-emitting element 201 is smaller than the emission wavelength of the second color light-emitting element 202. The luminous efficiency of the second color light-emitting element 202 is lower than the luminous efficiency of the first color light-emitting element 201. Therefore, it is specified in the present disclosure that h03−h01<h04−h02, which helps to increase the height of the fourth sub-portion 304 covering the side surface of the second color light-emitting element 202, which has lower luminous efficiency. This reduces the height obstructed by the light-shielding layer 40 on the side surface of the second color light-emitting element 202, thus enhancing the lateral luminous flux of the second color light-emitting element 202 and mitigating the difference in the luminous flux caused by the different luminous efficiency of the second color light-emitting element 202 and the first light-emitting element 20.

Figure 16:
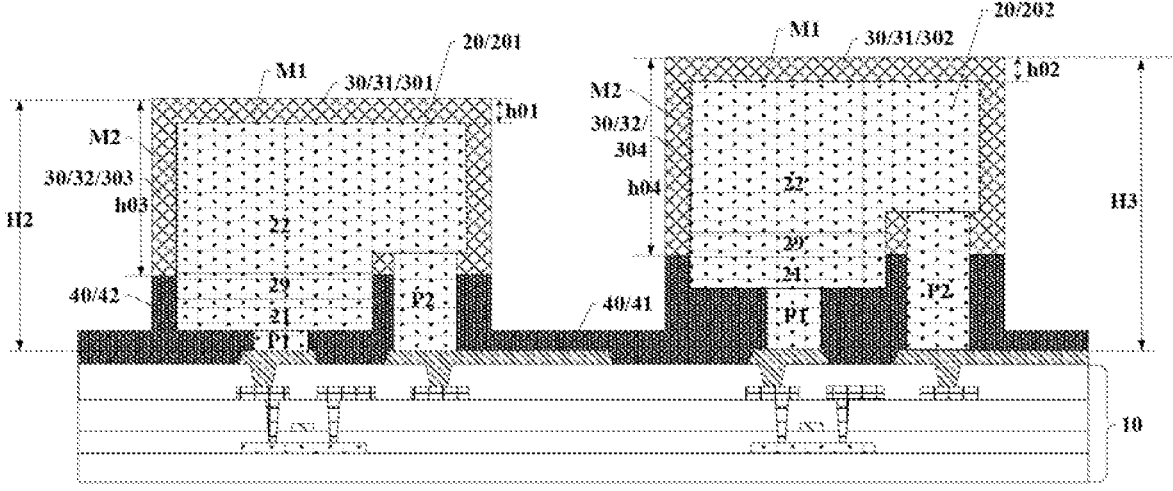
FIG. 16 is a diagram showing a relative positional relationship between a first color light-emitting element as well as a second color light-emitting element and an array layer.

FIG. 16 is a diagram showing a relative positional relationship between a first color light-emitting element 201 as well as a second color light-emitting element 202 and an array layer 10. This embodiment shows an approach where the heights of the first color light-emitting element 201 and the second color light-emitting element 202 are different. In this embodiment, description is made by using an example where the height of the first color light-emitting element 201 is lower than the height of the second color light-emitting element 202. When the emission wavelength of the first color light-emitting element 201 is smaller than the emission wavelength of the second color light-emitting element 202, and the luminous efficiency of the second color light-emitting element 202 is lower than the luminous efficiency of the first color light-emitting element 201, increasing the height of the second color light-emitting element 202, which has lower luminous efficiency helps to reduce the distance between the second color light-emitting element 202 and the light exit surface of the display panel. This diminishes the light loss in the process of transmitting light emitted from the second color light-emitting element 202 to the light exit surface of the display panel, thereby enhancing the luminous flux of the second color light-emitting element 202. For the approach where the heights of the first color light-emitting element 201 and the second color light-emitting element 202 are different, the relationship among the heights of the first sub-portion 301, the second sub-portion 302, the third sub-portion 303, and the fourth sub-portion 304 can also be expressed as h03−h01<h04−h02, so as to increase the height of the fourth sub-portion 304 covering the side surface of the second color light-emitting element 202 with lower luminous efficiency. This reduces the height obstructed by the light-shielding layer 40 on the side surface of the second color light-emitting element 202, thus enhancing the lateral luminous flux of the second color light-emitting element 202 and mitigating the difference in the luminous flux caused by the different luminous efficiency of the second color light-emitting element 202 and the first light-emitting element 20.

Further referring to FIG. 16, in an optional embodiment of the present disclosure, along the first direction F1, the height of the first color light-emitting element 201 is H2, and the height of the second color light-emitting element 202 is H3, where (h03−h01)/H2<(h04−h02)/H3. In an embodiment, the surfaces, which face the array layer 10, of the first electrode P1 and the second electrode P2 in the first light-emitting element 20 are flush with each other. In the context of this embodiment, the height H2 of the first color light-emitting element 201 refers to a distance between the first surface M1 of the first color light-emitting element 201 and the surface, which faces the array layer 10, of the first electrode P1 and/or the second electrode P2 in the first color light-emitting element 201. The height H3 of the second color light-emitting element 202 refers to a distance between the first surface M1 of the second color light-emitting element and the surfaces, which face the array layer, of the first electrode P1 and the second electrode P2 in the second color light-emitting element 202. The embodiment shown in FIG. 16 illustrates only the case where the surfaces, which face the array layer 10, of the first electrode P1 and the second electrode P2 in the first light-emitting element 20 are flush with each other. It should be noted that when the surfaces, which face the array layer 10, of the first electrode P1 and the second electrode P2 in the first light-emitting element 20 are not flush with each other, the height of the first light-emitting element 20 refers to a distance between the first surface M1 of the first light-emitting element 20 and a surface closer to the array layer in the surfaces of the first electrode P1 and the second electrode P2 that face the array layer 10.

In an embodiment, h03>h01 and h04>h02, h03−h01 indicates an additional height of the second sub-portion 302 compared to the first sub-portion 301 in the first color light-emitting element 201, i.e., the actual height of the protective layer on the side surface of the first color light-emitting element 201. (h03−h01)/H2 indicates a ratio of the actual height of the protective layer on the side surface of the first color light-emitting element 201 to the height of the first color light-emitting element 201. h04−h02 indicates an additional height of the fourth sub-portion 304 compared to the second sub-portion 302 in the second color light-emitting element 202, i.e., the actual height of the protective layer on the side surface of the second color light-emitting element 202. (h04−h02)/H3 indicates a ratio of the actual height of the protective layer on the side surface of the second color light-emitting element 202 to the height of the second color light-emitting element 202. In this embodiment, it is specified that (h03−h01)/H2<(h04−h02)/H3. This embodiment increases the proportion of the area of the protective layer on the side surface of the second color light-emitting element 202 with lower luminous efficiency. This is conducive to enhancing the lateral luminous flux of the second color light-emitting element 202, thereby promoting the overall luminous flux of the second color light-emitting element 202. In an embodiment, the heights of the first color light-emitting element 201 and the second color light-emitting element 202 may be the same or different. For example, the height H3 of the second color light-emitting element 202 can be set to be greater than the height 112 of the first color light-emitting element 201, so as to reduce the distance between the second color light-emitting element 202 with lower luminous efficiency and the light exit surface of the display panel, thereby reducing light loss for the second color light-emitting element 202 and enhancing light utilization efficiency of the second color light-emitting element 202.

Figure 17:
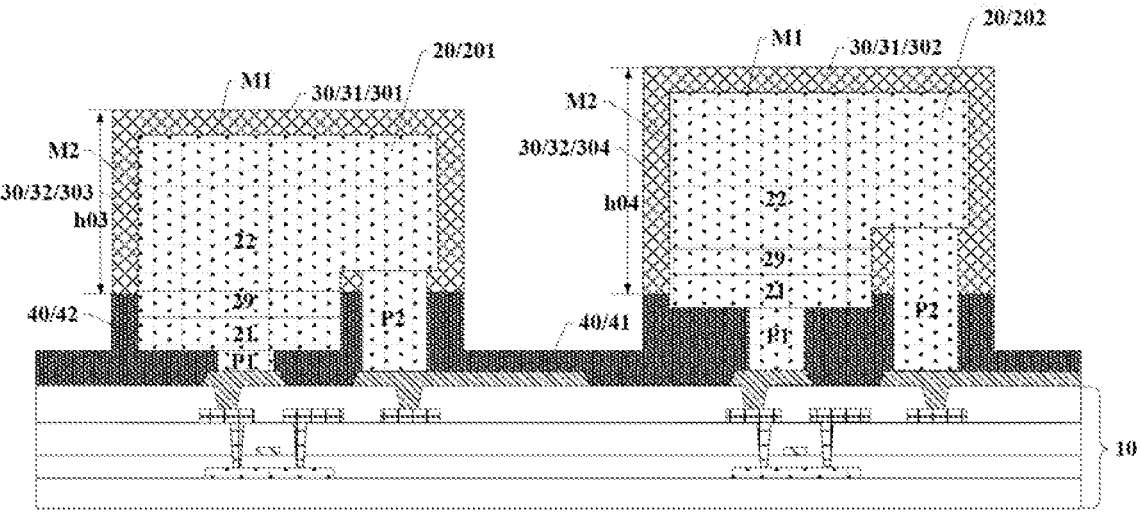
FIG. 17 is a diagram showing another relative positional relationship between a first color light-emitting element as well as a second color light-emitting element and an array layer.

FIG. 17 is a diagram showing another relative positional relationship between a first color light-emitting element 201 as well as a second color light-emitting element 202 and an array layer 10. Referring to FIG. 17, in an optional implementation of the present disclosure, the first light-emitting elements 20 include a first color light-emitting element 201 and a second color light-emitting element 202. The emission wavelength of the first color light-emitting element 201 is shorter than that of the second color light-emitting element 202. The second protective portion 32 includes a third sub-portion 303 corresponding to the first color light-emitting element 201, and a fourth sub-portion 304 corresponding to the second color light-emitting element 202. Along the first direction F1, the third sub-portion 303 has a height of h03, and the fourth sub-portion 304 has a height of h04. The first color light-emitting element 201 and the second color light-emitting element 202 have different heights, where h03≠h04.

Specifically, when the heights of the first color light-emitting element 201 and the second color light-emitting element 202 are different, the heights of the second sub-portion 302 corresponding to the first color light-emitting element 201 and the fourth sub-portion 304 corresponding to the second color light-emitting element 202 are designed to be different. The first light-emitting element 20 is inverted and immersed into a container containing a transparent hydrophilic or hydrophobic material, such that the first surface M1 and at least a partial side surface of the first light-emitting element 20 are submerged in the material. Upon curing, the third sub-portion 303 and the fourth sub-portion 304 are formed. Due to the different heights of the first color light-emitting element 201 and the second color light-emitting element 202, when the second color light-emitting element 202 is higher, a larger area of the second color light-emitting element 202 is submerged in the material. As a result, the height of the fourth sub-portion 304 formed on the side surface of the second color light-emitting element 202 will be greater than the height of the third sub-portion 303 formed on the side surface of the second color light-emitting element 202, thereby enhancing the lateral luminous flux of the second color light-emitting element 202. Furthermore, through a single immersion process, the higher fourth sub-portion 304 can be formed on the side surface of the higher second color light-emitting element 202, which helps to simplify the manufacturing process of the display panel.

Figure 18:
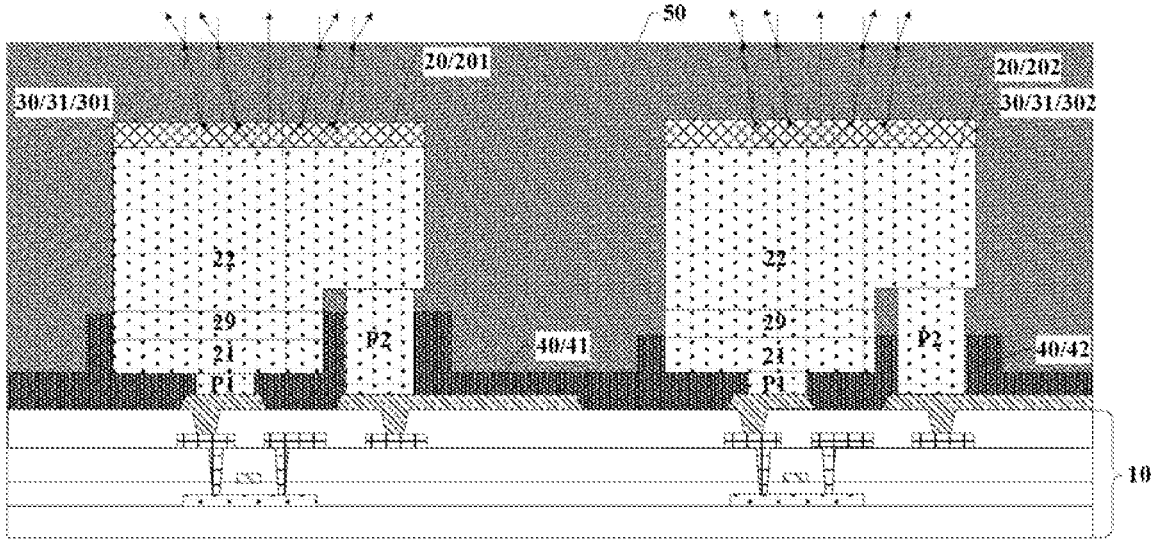
FIG. 18 is a schematic structural diagram after introduction of a packaging layer into a display panel.
Figure 19:
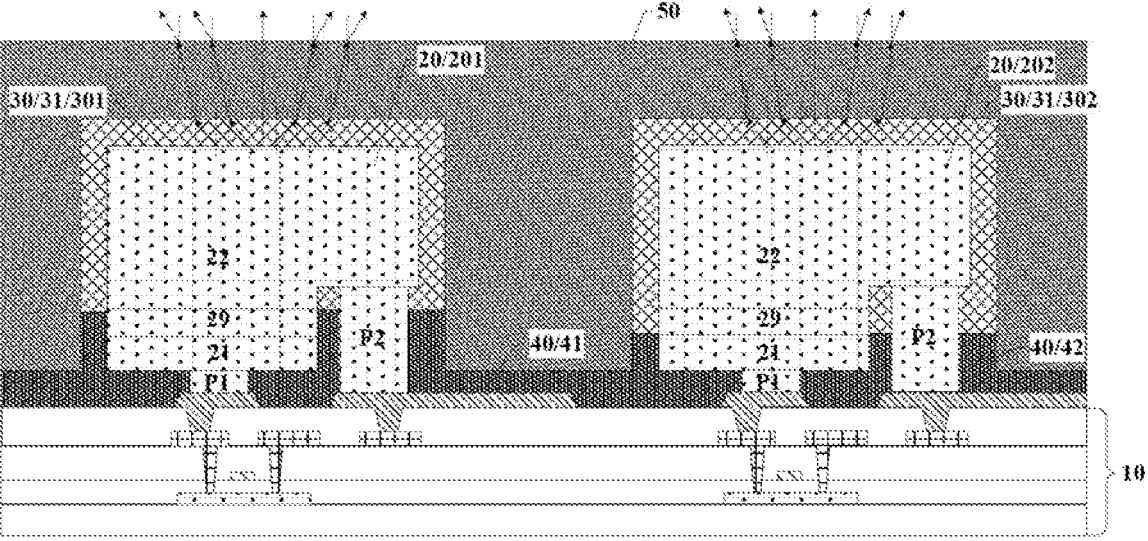
FIG. 19 is another schematic structural diagram after introduction of a packaging layer into a display panel.

FIG. 18 and FIG. 19 are each a schematic structural diagram after introduction of a packaging layer 50 into a display panel. The difference between FIG. 18 and FIG. 19 lies in different coverage areas on the first light-emitting element by the protective layer 30. In FIG. 18, the protective layer is arranged only on the first surface of the first light-emitting element 20, while in FIG. 20, the protective layer is arranged on both the first surface and the side surface of the first light-emitting element 20. Referring to FIG. 18 and FIG. 19, in an optional implementation of the present disclosure, the display panel further includes a packaging layer 50, which is located at a side of the protective layer 30 away from the array layer 10. The packaging layer 50 has a refractive index of n0.

The first light-emitting elements 20 include a first color light-emitting element 201 and a second color light-emitting element 202. An emission wavelength of the first color light-emitting element 201 is smaller than that of the second color light-emitting element 202. The first protective portion 31 includes a first sub-portion 301 corresponding to the first color light-emitting element 201 and a second sub-portion 302 corresponding to the second color light-emitting element 202. The first sub-portion 301 has a refractive index of n1, and the second sub-portion 302 has a refractive index of n2, where n1<n2<n0.

Specifically, when the emission wavelength of the first color light-emitting element 201 is smaller than that of the second color light-emitting element 202, the luminous efficiency of the second color light-emitting element 202 is lower than that of the first color light-emitting element 201. In this case, the refractive indices of the first sub-portion 301 corresponding to the first color light-emitting element 201 and the second sub-portion 302 corresponding to the second color light-emitting element 202 are designed to be different in this embodiment of the present disclosure. While the refractive indices of the first sub-portion 301 and the second sub-portion 302 are both smaller than the refractive index of the packaging layer 50, in the present disclosure, it is specified that the refractive index n1 of the first sub-portion 301 is smaller than the refractive index n2 of the second sub-portion 302. In this way, when the light emitted by the second color light-emitting element 202 travels from the second sub-portion 302 to the packaging layer 50, and subsequently exits from the packaging layer 50, the light emitted by the second color light-emitting element 202 will exhibit a light path closer to a front viewing angle compared to the light emitted by the first color light-emitting element 201 when traveling from the first sub-portion 301 to the packaging layer 50. This enhances luminous flux in the front viewing angle of the second color light-emitting element 202 with lower luminous efficiency, thus increasing the brightness of the second color light-emitting element 202, and mitigating the brightness disparities arising from different luminous efficiency of different-colored light-emitting elements.

In an embodiment, $1.5 \le n1 < n2 \le 2.0$.

Figure 20:
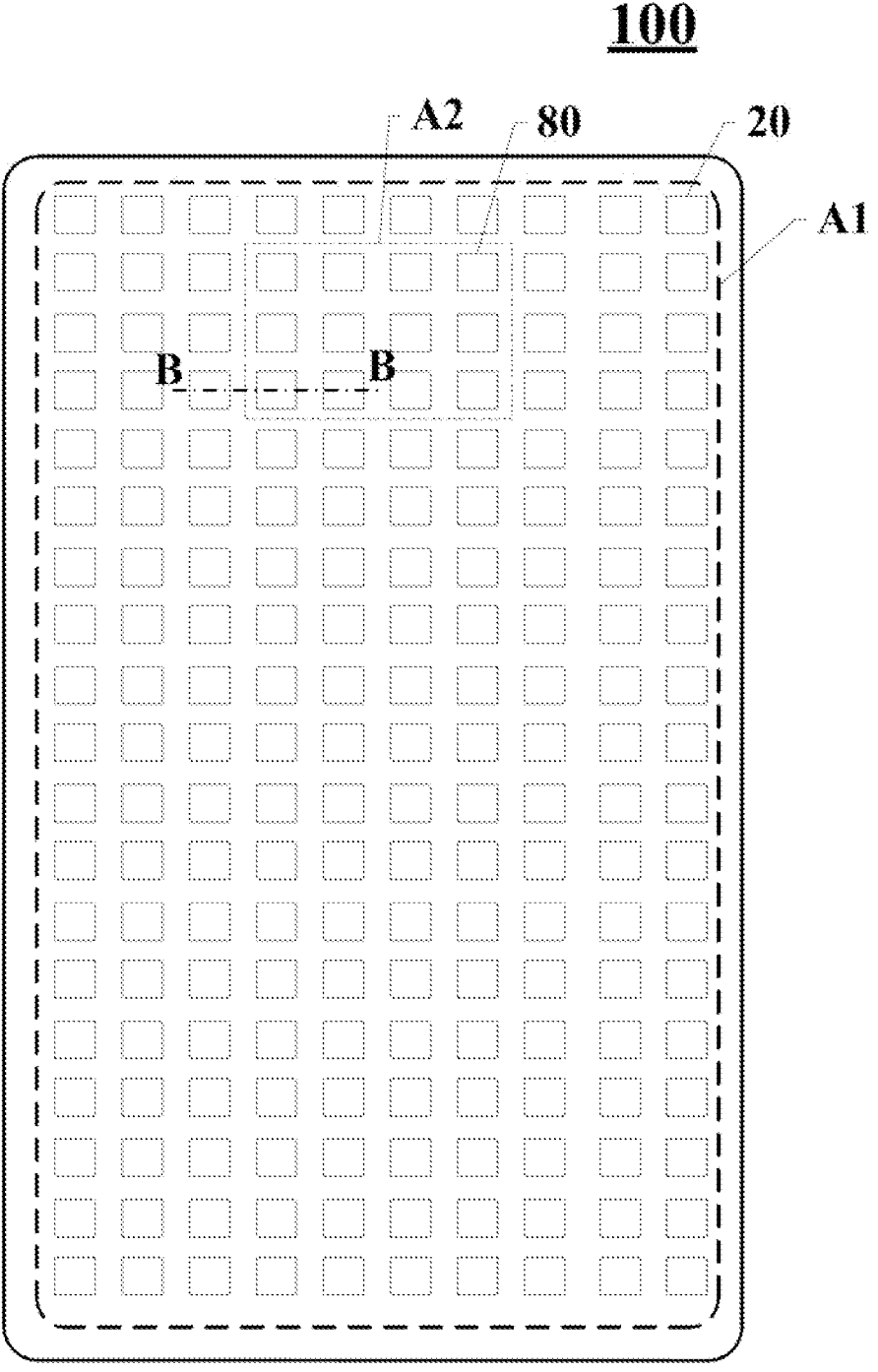
FIG. 20 is another schematic structural diagram of a display panel according to an embodiment of the present disclosure.
Figure 21:
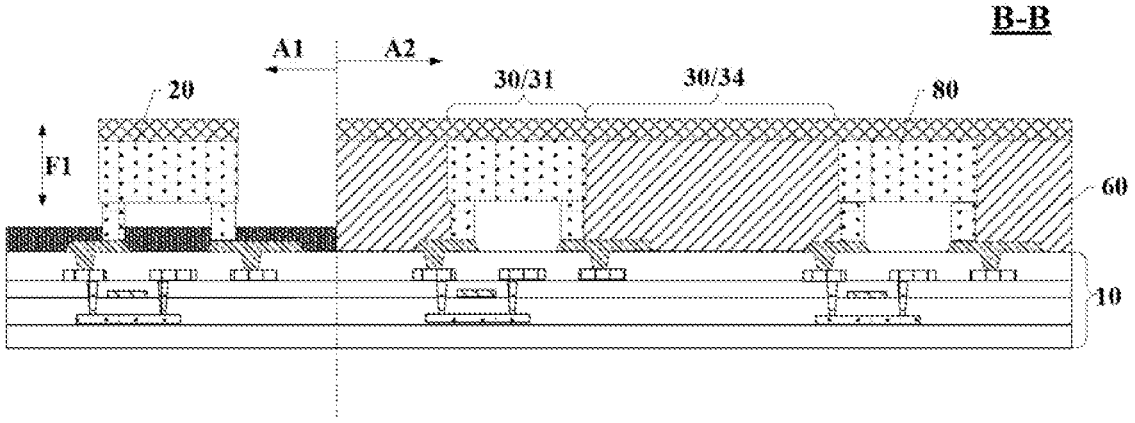
FIG. 21 is cross-sectional view taken along BB in FIG. 20.

FIG. 20 is another schematic structural diagram of a display panel according to an embodiment of the present disclosure; and FIG. 21 is a cross-sectional view taken along BB in FIG. 20. Referring to FIG. 20 and FIG. 21, in an optional implementation of the present disclosure, the display panel further includes a second display region A2 and second light-emitting elements 80 located in the second display region A2. The first display region A1 at least partially surrounds the second display region A2. The protective layer 30 includes a fourth protective portion 34, which is located in the second display region A2 and at least between adjacent second light-emitting elements 80.

Specifically, this embodiment illustrates an approach where the display panel further includes a second display region A2. The second display region A2 may be, for example, a transparent display region. Optical sensing components such as cameras can be placed at corresponding positions in the second display region A2. During an optical sensing phase (e.g., photography phase), the second light-emitting elements 80 in the second display region A2 are invisible, and light passes through the transparent second display region A2 to reach the optical sensing components.

Figure 22:
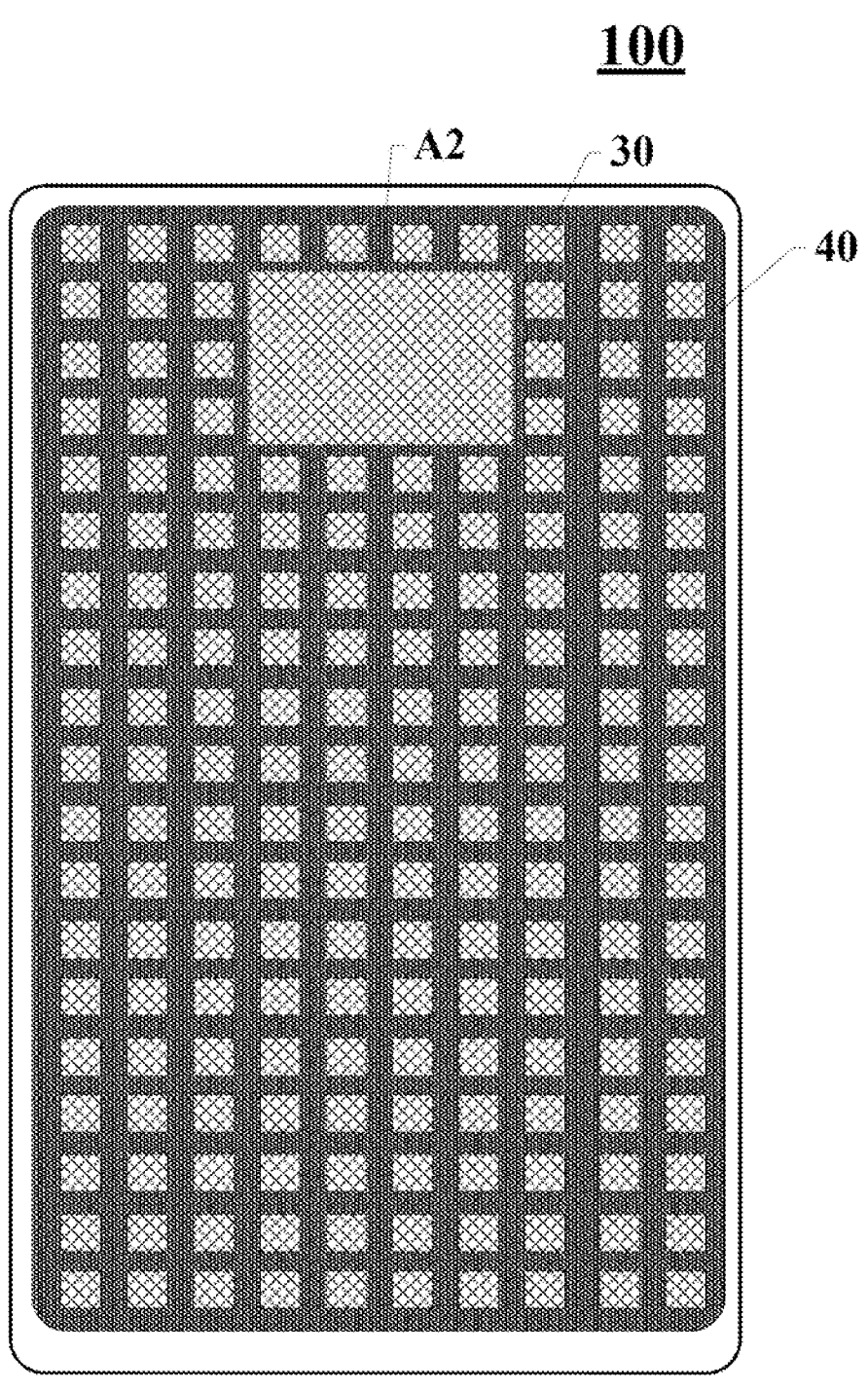
FIG. 22 is a distribution diagram of a light-shielding layer and a protective layer in a first display region and a second display region.

During a display phase, the second light-emitting elements 80 in the second display region A2 exhibit the display function. In this embodiment of the present disclosure, a fourth protective portion 34 is arranged in the second display region A2. Orthographic projection of the fourth protective portion 34 on the light exit surface of the display panel is located at least between adjacent second light-emitting elements 80. For example, referring to FIG. 22, which is a distribution diagram of a light-shielding layer 40 and a protective layer 30 in a first display region A1 and a second display region A2, the light-shielding layer 40 is only arranged in the first display region A1, but not arranged in the second display region A2. By introducing the fourth protective portion 34 between adjacent second light-emitting elements 80 in the second display region A2, the light-shielding layer 40 will not extend into the second display region A2 due to the repellent wettability properties of the fourth protective portion 34 and the light-shielding layer 40. This helps to avoid impact on the transmittance of the second display region A2 caused by the extension of the light-shielding layer 40 into the second display region A2. Under the protection of the fourth protective portion 34, the transparency of the second display region A2 is effectively ensured.

Further referring to FIG. 21, in an optional implementation of the present disclosure, the second display region A2 includes a transparent heightening portion 60 located between adjacent second light-emitting elements 80. A surface of the transparent heightening portion 60 away from the array layer 10 is flush with a surface of the second light-emitting element 80 away from the array layer 10. The fourth protective portion 34 is located on the surface of the transparent heightening portion 60 away from the array layer 10 and the surface of the second light-emitting element 80 away from the array layer 10.

In this embodiment, the transparent heightening portion 60 is introduced between adjacent second light-emitting elements 80. The surfaces of the transparent heightening portion 60 and the second light-emitting element 80 that are away from the array layer 10 are in the same plane. In this way, portions of the protective layer 30 that are in the first display region A1 and the second display region A2 can be formed in the same manufacturing process. For example, the first light-emitting element 20 and the second light-emitting element 80 can be inverted and immersed in a container containing a hydrophilic or hydrophobic material. Due to the presence of the transparent heightening portion 60, which is flush with the second light-emitting element 80, between adjacent second light-emitting elements 80, a portion of the transparent heightening portion 60 will also be immersed in the material. This approach simplifies the manufacturing process of the protective layer 30 in the first display region A1 and the second display region A2, thereby improving the overall production efficiency of the display panel.

Figure 23:
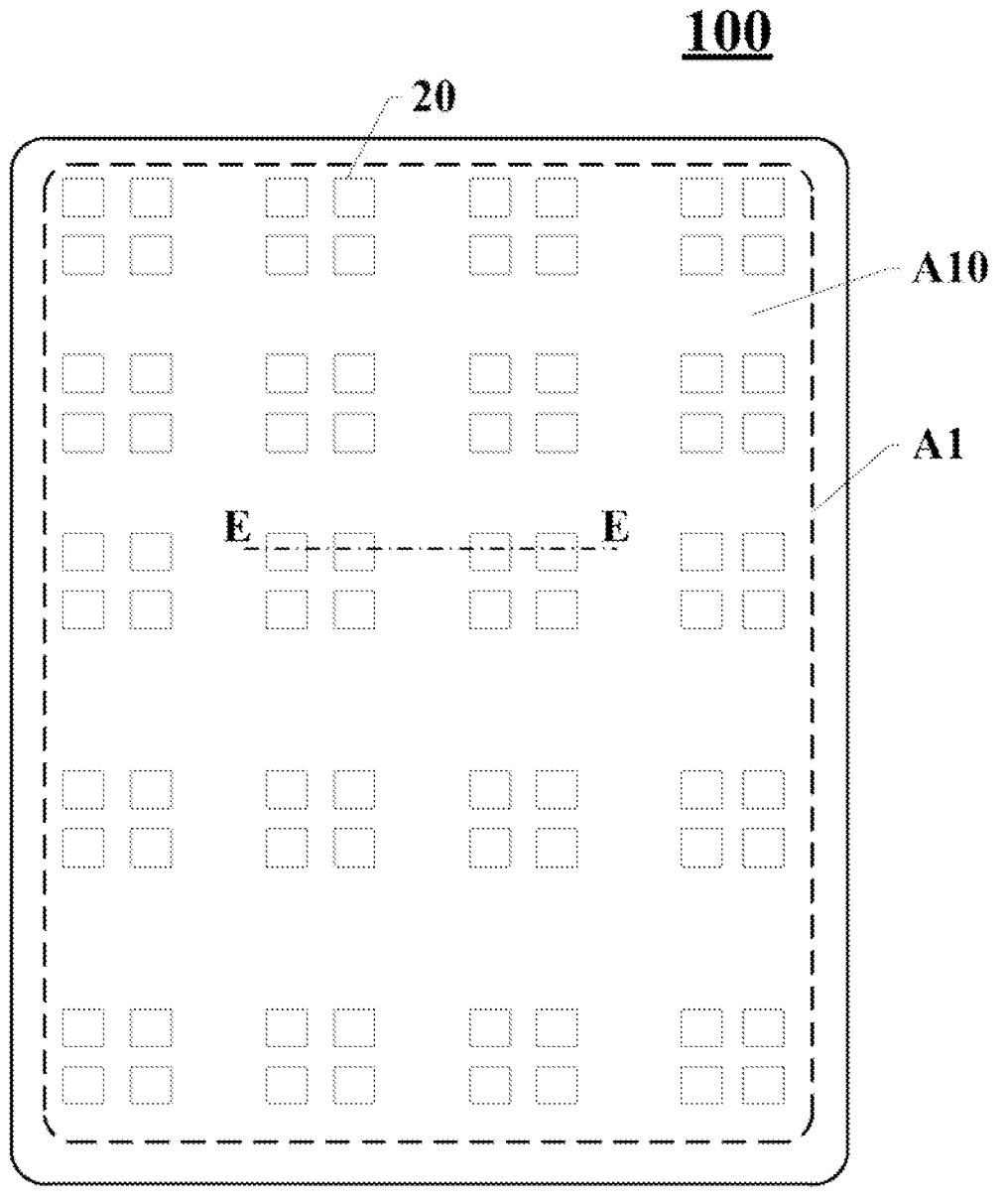
FIG. 23 is another schematic structural diagram of a display panel according to an embodiment of the present disclosure.
Figure 24:
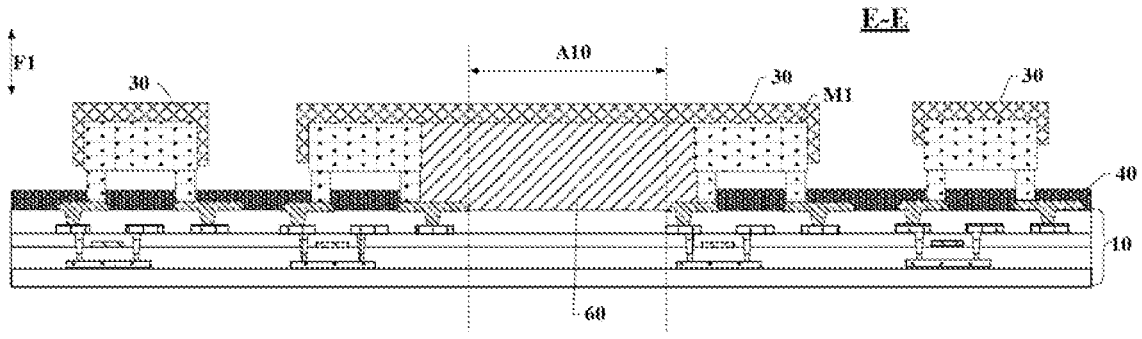
FIG. 24 is cross-sectional view of the display panel taken along EE in FIG. 23.

FIG. 23 is another schematic structural diagram of a display panel according to an embodiment of the present disclosure; and FIG. 24 is a cross-sectional view of the display panel taken along EE in FIG. 23. The display panel in this embodiment is a transparent display panel. In an embodiment, the first display region A1 includes a transparent region A10. It should be noted that FIG. 23 merely provides a representative layout for the first light-emitting elements 20, but does not restrict the actual arrangement, dimensions, or quantity of the first light-emitting elements 20. In an embodiment, the transparent heightening portion 60 can also be arranged in the transparent region A10. The surface of the transparent heightening portion 60 away from the array layer is flush with the first surface M1 of the first light-emitting element 20. The protective layer 30 covers the surface of the transparent heightening portion 60 away from the array layer 10. This approach helps to avoid any adverse impact on the transparency of the display panel caused by the extension of the light-shielding layer 40 into the transparent region A10.

Figure 25:
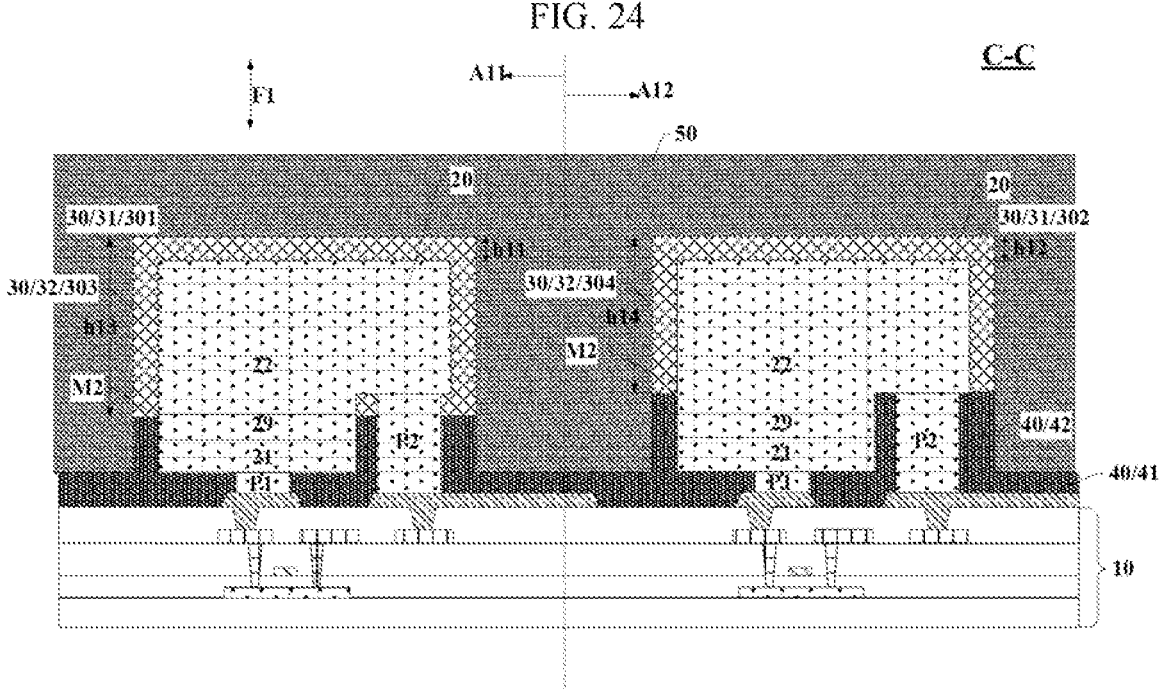
FIG. 25 is cross-sectional view of the display panel taken along CC in FIG. 1.

FIG. 25 is a cross-sectional view of the display panel taken along CC in FIG. 1. This embodiment illustrates an approach where the protective layers corresponding to the first light-emitting elements 20 in a first display sub-region A11 and a second display sub-region A12 of the first display region A1 are designed to be different.

Referring to FIG. 1 and FIG. 25, in an optional implementation of the present disclosure, the first display region A1 includes a first display sub-region A11 and a second display sub-region A12, where the first display sub-region A11 at least partially surrounds the second display sub-region A12. The protective layer 30 further includes second protective portions 32. The first light-emitting element 20 further includes a first side surface M2 in contact with the first surface M1. The second protective portion 32 is located on the first side surface M2.

The first protective portion 31 includes a first sub-portion 301 corresponding to the first light-emitting element 20 in the first display sub-region A11 and a second sub-portion 302 corresponding to the first light-emitting element 20 in the second display sub-region A12. The second protective portion 32 includes a third sub-portion 303 corresponding to the first light-emitting element 20 in the first display sub-region A11 and a fourth sub-portion 304 corresponding to the first light-emitting element 20 in the second display sub-region A12. Along the first direction F1, the first sub-portion 301 has a height of h11, the second sub-portion 302 has a height of h12, the third sub-portion 303 has a height of h13, and the fourth sub-portion 304 has a height of h14. The first direction F1 is perpendicular to the plane of the display panel, where h13−h11>h14−h12.

Specifically, the first display sub-region A11 in the first display region A1 at least partially surrounds the second display sub-region A12. The second display sub-region A12 can be regarded as a central display region of the display panel, and the first display sub-region A11 can be regarded as a peripheral display region of the display panel. In the related art, there is a common issue of high display brightness in the central display region and low display brightness in the peripheral display region of the display panel. To address this issue, in this embodiment of the present disclosure, the height of the protective layer 30 is designed to be different corresponding to the first light-emitting elements 20 in the central display region and the peripheral display region, h13−h11 can be considered as the height of the protective layer actually located on the side surface of the first light-emitting element in the first display sub-region A11. h14−h12 can be considered as the height of the protective layer actually located on the side surface of the first light-emitting element 20 in the second display sub-region A12. In the present disclosure, it is specified that h13−h11>h14−h12, such that the side surface of the first light-emitting element 20 in the first display sub-region A11 (peripheral display region) is covered by the higher third sub-portion 303, to reduce the coverage area on the side surface of the first light-emitting element in the first display sub-region A11 by the light-shielding layer 40, thus enhancing the lateral luminous flux of the first light-emitting element 20 in the peripheral display region. This reduces the brightness difference between the peripheral display region and the central display region, thus improving the overall display uniformity of the display panel.

Figure 26:
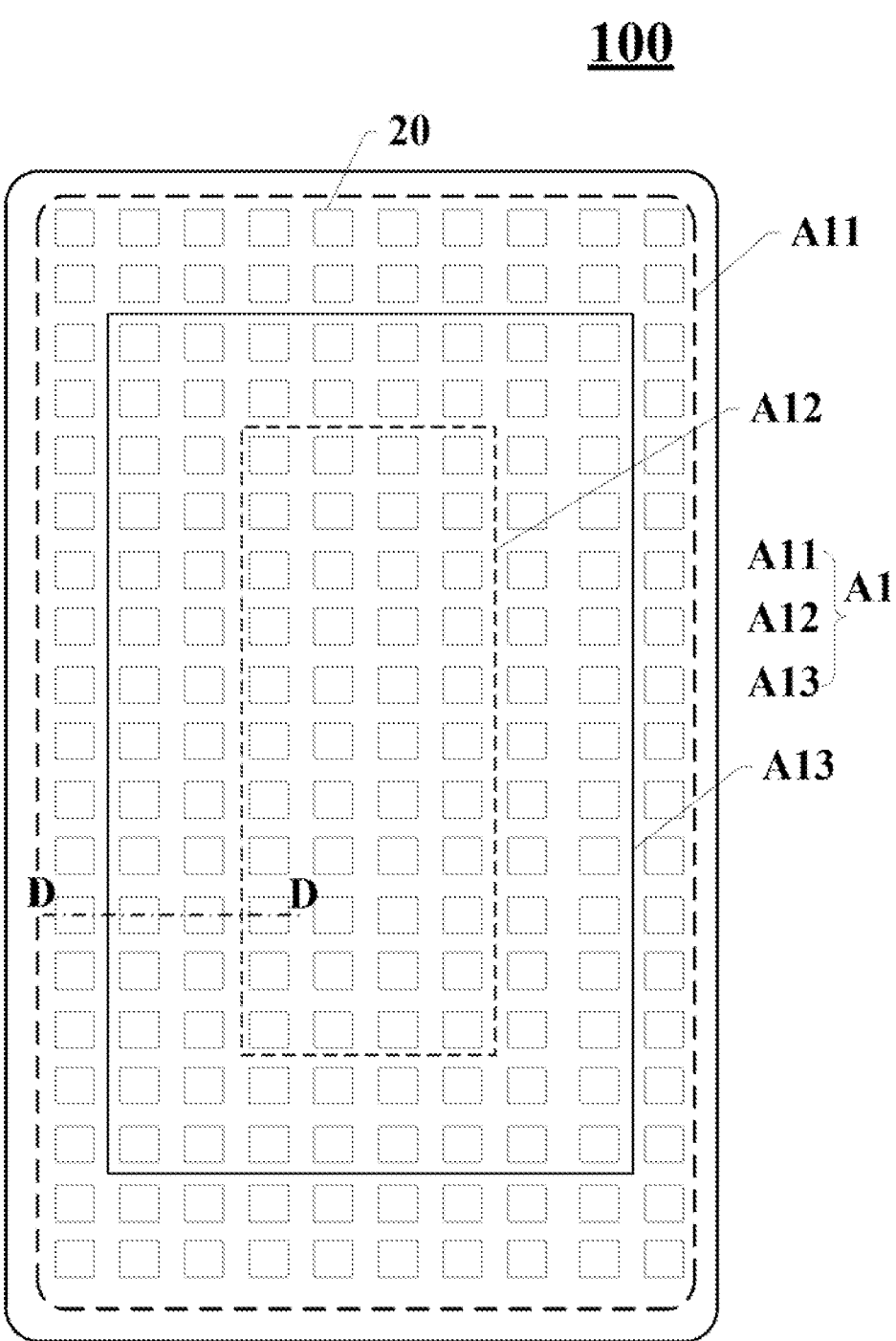
FIG. 26 is another schematic structural diagram of a display panel according to an embodiment of the present disclosure.
Figures 27, 28:
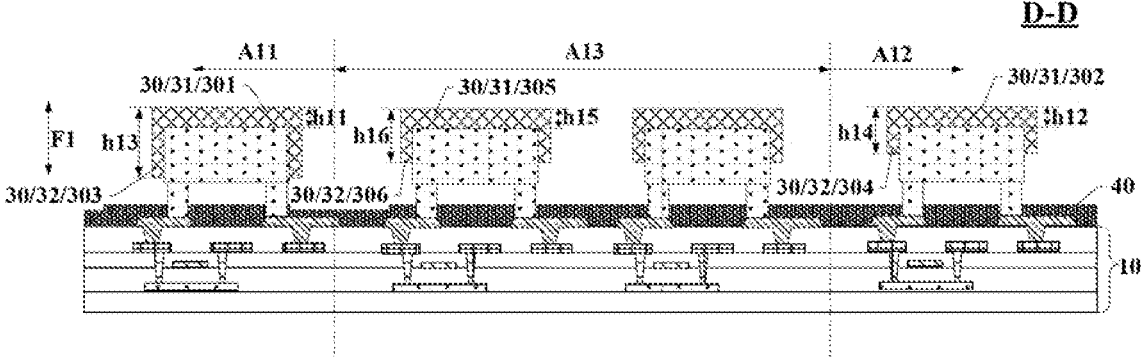
FIG. 27 is cross-sectional view of the display panel taken along DD in FIG. 26.
FIG. 28 is another cross-sectional view of the display panel taken along AA in FIG. 1.

FIG. 26 is another schematic structural diagram of a display panel according to an embodiment of the present disclosure: and FIG. 27 is a cross-sectional view of the display panel taken along DD in FIG. 26. This embodiment illustrates an approach where the protective layer 30 corresponding to the first light-emitting elements 20 in three display sub-regions at different positions of the display panel designed to be different.

Referring to FIG. 26 and FIG. 27, in an optional implementation of the present disclosure, the first display region A1 further includes a third display sub-region A13, which is located between the first display sub-region A11 and the second display sub-region A12. The first protective portion 31 includes a fifth sub-portion 305 corresponding to the first light-emitting element 20 in the third display sub-region A13. The second protective portion 32 includes a sixth sub-portion 306 corresponding to the first light-emitting element 20 in the third display sub-region A13. Along the first direction F1, the fifth sub-portion 305 has a height of h15, and the sixth sub-portion 306 has a height of h16.

$$(h13−h11)−(h16−h15)>(h16−h15)−(h14−h12)>0.$$

Specifically, this embodiment illustrates an approach where a third display sub-region A13 is arranged between the first display sub-region A11 and the second display sub-region A12. The first display sub-region A11 can be considered as the peripheral display region of the display panel, the second display sub-region A12 can be considered as the central display region of the display panel, and the third display sub-region A13 can be considered as a secondary peripheral display region located between the first display sub-region A11 and the second display sub-region A12. h13−h11 can be considered as the height of the protective layer actually located on the side surface of the first light-emitting element 20 in the first display sub-region A11. h14−h12 can be considered as the height of the protective layer actually located on the side surface of the first light-emitting element 20 in the second display sub-region A12. h16−h15 can be considered as the height of the protective layer actually located on the side surface of the first light-emitting element 20 in the third display sub-region A13. In this embodiment of the present disclosure, it is specified that (h13−h11)−(h16−h15)>(h16−h15)−(h14−h12) >0, which is equivalent to (h13−h11)>(h16−h15)>(h14−h12). In this way, the third sub-portion 303 corresponding to the first light-emitting element 20 in the outermost first display sub-region A11 has the greatest height. The sixth sub-portion 306 corresponding to the first light-emitting element 20 in the third display sub-region A13 has a height lower than the height of the third sub-portion 303 in the first display sub-region A11 and greater than the height of the fourth sub-portion 304 in the second display sub-region A12. The fourth sub-portion 304 corresponding to the first light-emitting element 20 in the second display sub-region A12 has the smallest height. In other words, in a direction from the peripheral display region to the central display region, the heights of the protective portions on the side surfaces of the first light-emitting elements 20 are decreasing. With a higher protective portion on the side surface, a smaller area on the side surface of the first light-emitting element 20 is obstructed by the light-shielding layer 40, thus enhancing the lateral luminous flux of the first light-emitting element 20. Therefore, the aforementioned design ensures that the lateral luminous flux of the first light-emitting element 20 in the first display sub-region A11 is maximum, the lateral luminous flux of the first light-emitting element 20 in the third display sub-region A13 falls between that of the first display sub-region A11 and the second display sub-region A12, and the lateral luminous flux of the first light-emitting element 20 in the second display sub-region A12 is minimum. In the related art, the brightness in the peripheral display region is lower than the brightness in the central display region. In the embodiments of the present disclosure, the aforementioned design is adopted to effectively reduce the display brightness difference between different display sub-regions, thereby improving the display uniformity of the display panel.

FIG. 28 is another cross-sectional view of the display panel taken along AA in FIG. 1. Referring to FIG. 28, in an optional implementation of the present disclosure, the display panel further includes a blocking portion 70, which is located between the array layer 10 and the first light-shielding portion 41. One of the blocking portion 70 and the protective layer 30 contains a hydrophilic material, while the other contains a hydrophobic material.

In this embodiment, a blocking portion 70 is introduced between the first light-shielding portion 41 and the array layer 10. In the actual fabrication process, before the protective layer 30 is fabricated, the blocking portion 70 can be formed between adjacent first light-emitting elements 20 through printing. The blocking portion 70 and the protective layer 30 have mutually repelling wettability properties. After the blocking portion 70 is fabricated, during the fabrication of the protective layer 30, the protective layer 30 will not extend to the upper surface of the array layer 10 under the effect of the blocking portion 70. If the protective layer 30 is present on the upper surface of the array layer 10, the area covered by the protective layer 30 cannot be effectively shielded by the subsequently fabricated light-shielding layer 40, which would affect the overall anti-reflection performance of the display panel. Therefore, the blocking portion 70 in this embodiment of the present disclosure ensures that the subsequently fabricated light-shielding layer 40 can effectively cover the surface of the array layer 10 facing the first light-emitting elements 20, thus enhancing the overall anti-reflection performance of the display panel.

In an embodiment, both the light-shielding layer 40 and the blocking portion 70 mentioned in this embodiment of the present disclosure can be fabricated through printing.

Figure 29:
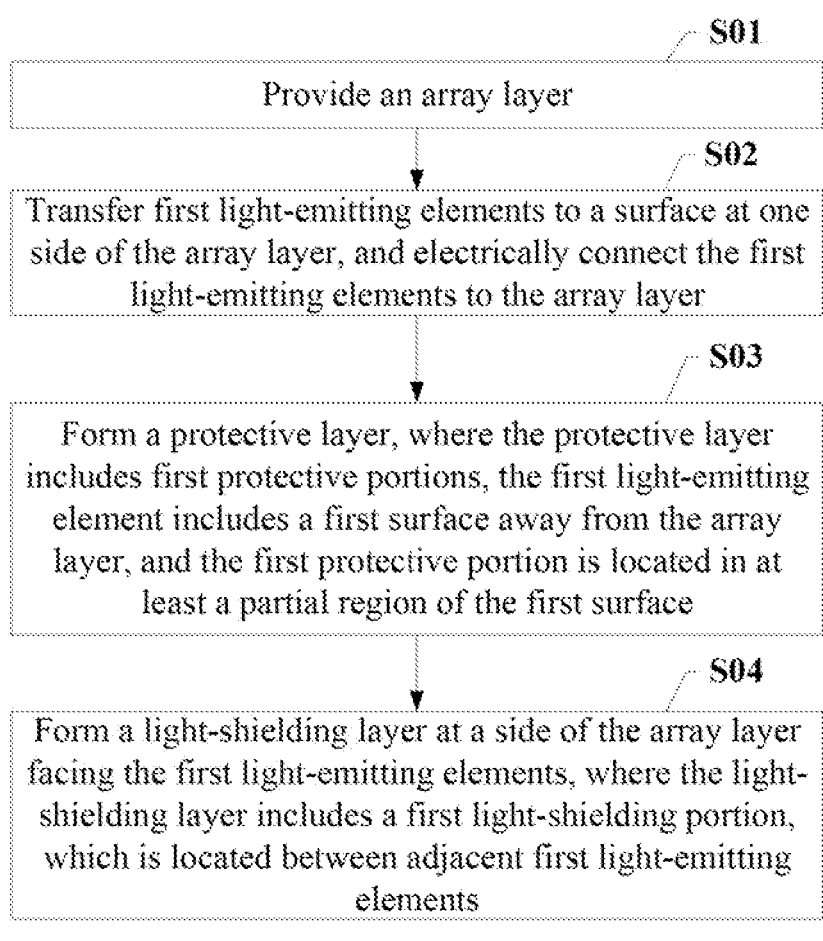
FIG. 29 is a flowchart of a manufacturing method of a display panel according to an embodiment of the present disclosure.
Figure 30:
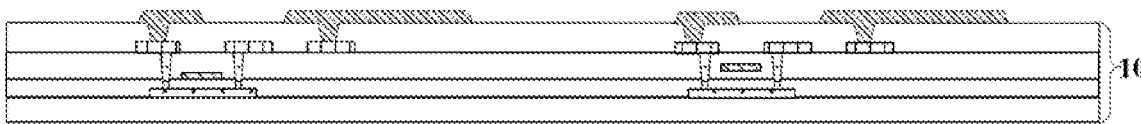
FIG. 30 is a schematic structural diagram of an array layer according to an embodiment of the present disclosure.

FIG. 29 is a flowchart of a manufacturing method of a display panel according to an embodiment of the present disclosure. Referring to FIG. 29, based on the same inventive conception, the present disclosure further provides a manufacturing method of a display panel, applied to the display panel provided by the aforementioned embodiments. The manufacturing method includes the following steps:

In S01, an array layer 10 is provided, as shown in FIG. 30. FIG. 30 is a schematic structural diagram of an array layer 10 according to an embodiment of the present disclosure.

Figure 31:
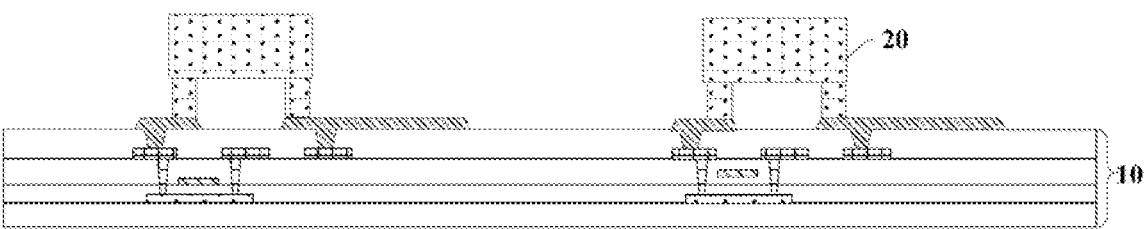
FIG. 31 is a schematic structural diagram after first light-emitting elements are electrically connected to an array layer.

In S02, first light-emitting elements 20 are transferred to a surface at one side of the array layer 10, and are electrically connected to the array layer 10, as shown in FIG. 31. FIG. 31 is a schematic structural diagram after first light-emitting elements 20 are electrically connected to an array layer 10.

Figure 32:
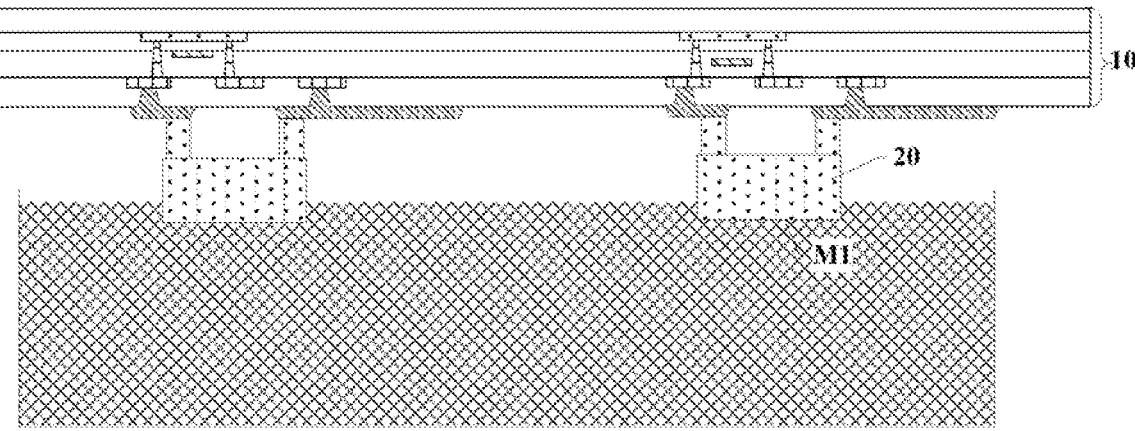
FIG. 32 is a schematic diagram showing a process of forming a protective layer.
Figure 33:
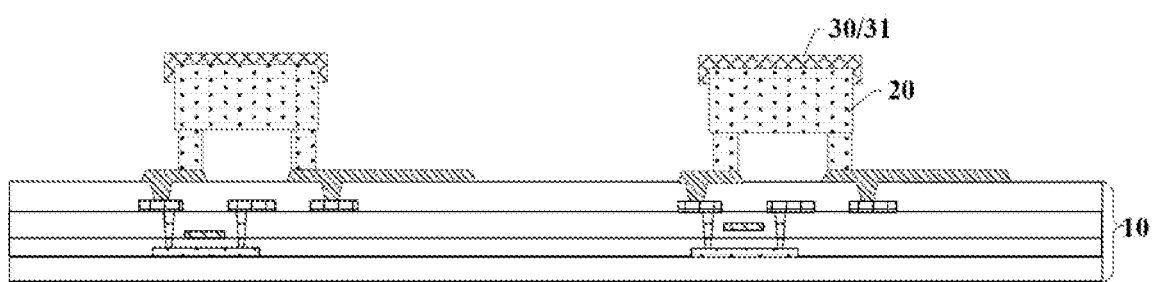
FIG. 33 is a schematic structural diagram after curing of a protective layer.

In S03, a protective layer 30 is formed, where the protective layer 30 includes first protective portions 31, the first light-emitting element 20 includes a first surface M1 away from the array layer 10, and the first protective portion 31 is located in at least a partial region of the first surface M1, as shown in FIG. 32 and FIG. 33. FIG. 32 is a schematic diagram showing a process of forming a protective layer 30.

The first light-emitting element 20 is inverted and then at least a portion of the first light-emitting element 20 is immersed in a container containing a liquid hydrophilic material or hydrophobic material. FIG. 33 is a schematic structural diagram after curing of a protective layer 30.

In S04, as shown in FIG. 9, a light-shielding layer 40 is formed at a side of the array layer 10 facing the first light-emitting elements 20, where the light-shielding layer 40 includes a first light-shielding portion 41 that is located between adjacent first light-emitting elements 20, one of the light-shielding layer 40 and the protective layer 30 contains a hydrophilic material, and the other contains a hydrophobic material.

In the manufacturing method of a display panel provided by the embodiments of the present disclosure, after the first light-emitting elements 20 are electrically connected to the array layer 10, the protective layer 30 is fabricated first. In this embodiment, manufacturing the protective layer 30 by using an immersion process is taken as an example for explanation. However, the manufacturing method of the protective layer 30 is not limited to. In some other embodiments of the present disclosure, a stamp-like approach can also be used to form the protective layer 30. For example, a layer of liquid hydrophilic or hydrophobic material that has not yet cured can be applied to a planar substrate first. Then, the first light-emitting elements 20 are inverted and placed on the substrate. After sufficient contact between the hydrophilic or hydrophobic material and the surfaces of the first light-emitting elements 20, the first light-emitting elements 20 are separated from the substrate, such that the hydrophilic or hydrophobic material is cured to form the protective layer 30. In an embodiment, the transmittance of the protective layer 30 is higher than that of the light-shielding layer 40. In an embodiment, the protective layer 30 is a transparent protective layer 30.

After the protective layer 30 is formed, the light-shielding layer 40 is then formed on the array layer 10. During the process of forming the light-shielding layer 40, due to the protective effect of the first protective portion 31 and the repellent wettability properties of the first protective portion 31 and the light-shielding layer 40, the light-shielding layer 40 cannot spread towards the first surface M1 of the first light-emitting element 20. This prevents the light-shielding layer 40 from affecting the light emission pattern and luminous flux of the first light-emitting element 20 when the light-shielding layer 40 spreads to the first surface M1 of the first light-emitting element 20. Therefore, it is beneficial for improving the display accuracy and luminous flux of the display panel.

Figure 34:
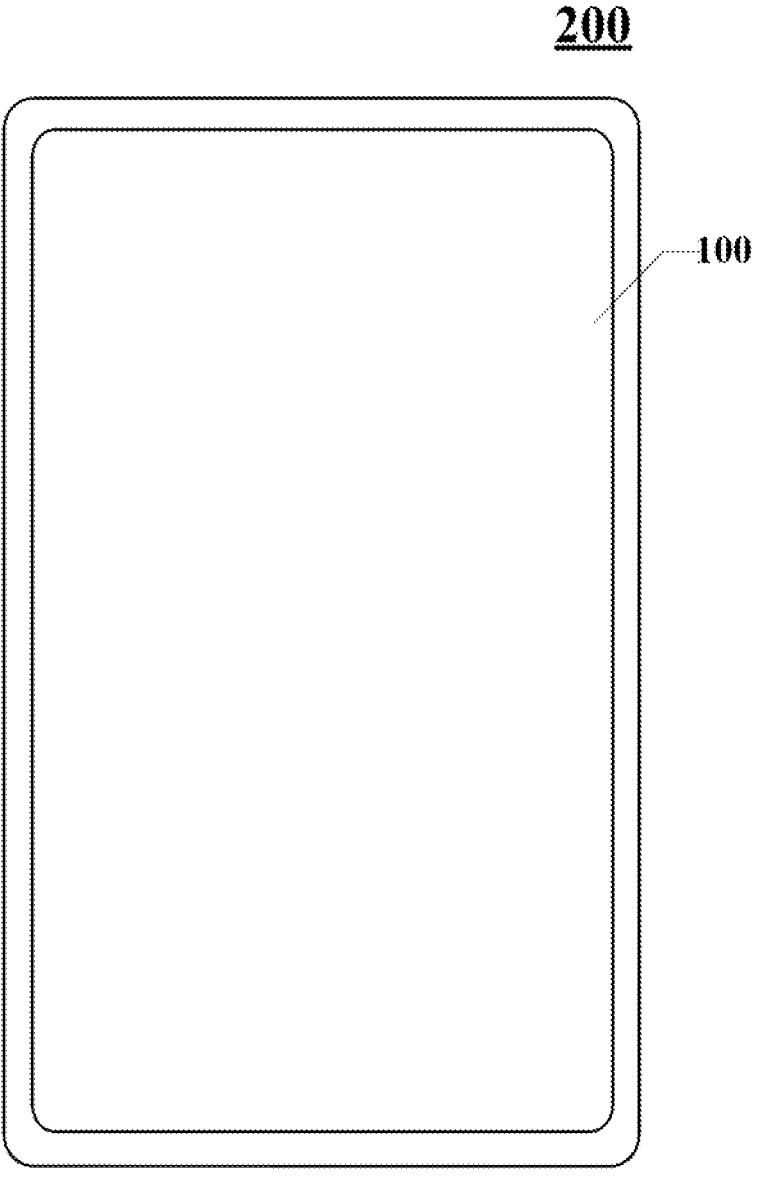
FIG. 34 is a top view of a display apparatus according to an embodiment of the present disclosure.

Based on the same inventive conception, the present disclosure further provides a display apparatus. Referring to FIG. 34, FIG. 34 is a top view of a display apparatus according to an embodiment of the present disclosure. The display apparatus 200 includes the display panel 100 in any one of the foregoing embodiments.

The display apparatus 200 provided by this embodiment of the present disclosure may be, for example, any electronic device having a display function, such as a touch screen, a mobile phone, a tablet computer, a notebook computer, an e-book, or a television. The display apparatus 200 provided by this embodiment of the present disclosure has the beneficial effect of the display panel 100 provided by the embodiments of the present disclosure. Reference can be made to the specific description of the display panel 100 in the foregoing embodiments, and details are not described herein again.

It should be understood that FIG. 34 is only an example illustrating a display apparatus 200 with a rounded rectangular structure. In other embodiments of the present disclosure, the display apparatus 200 may also be rectangular, circular, elliptical, or in any other feasible shape, which is not specifically limited in the present disclosure.

In conclusion, the display panel, the manufacturing method thereof, and the display apparatus that are provided by the present disclosure achieve at least the following beneficial effects:

The display panel and the display apparatus provided by the present disclosure include an array layer and first light-emitting elements that are located in a first display region and electrically connected to the array layer, and further include a light-shielding layer, where a first light-shielding portion of the light-shielding layer is located between adjacent first light-emitting elements. When external light is irradiated onto a light exit surface of the display panel, the first light-shielding portion can absorb the external light, thereby improving the anti-reflection-reflection performance of the display product. In particular, the present disclosure introduces a protective layer in the display panel. When the light-shielding layer is made of a hydrophilic material, the introduced protective layer is made of a hydrophobic material. When the light-shielding layer is made of a hydrophobic material, the introduced protective layer is made of a hydrophilic material. First protective portions of the protective layer are each located in at least a partial region of a first surface of the first light-emitting element that faces away from the array layer. In the manufacturing method of the display panel provided by the present disclosure, after first light-emitting elements are transferred to a surface at one side of an array layer and are electrically connected to the array layer, a protective layer is first formed. A first surface of the first light-emitting element is protected using a first protective portion in the protective layer. Then, a light-shielding layer is fabricated. During the process of forming the light-shielding layer, due to the protective effect of the first protective portion, the light-shielding layer cannot spread towards the first surface of the first light-emitting element. This prevents the light-shielding layer from affecting the light emission pattern and luminous flux of the first light-emitting element when the light-shielding layer spreads to the first surface of the first light-emitting element. Therefore, it is beneficial for improving the display accuracy and luminous flux of the display panel and the display apparatus.

Although some specific embodiments of the present disclosure have been explained in detail through examples, those skilled in the art should understand that the above examples are only for illustration and not intended to limit the scope of the present disclosure. Those skilled in the art should understand that modifications can be made to the aforementioned embodiments without departing from the scope and spirit of the present disclosure. The scope of the present disclosure is defined by the appended claims.

What is claimed is:

1. A display panel, comprising:
a first display region;
an array layer; first light-emitting elements;
a light-shielding layer and a protective layer,
wherein the first light-emitting elements are located in the first display region and electrically connected to the array layer;
wherein one of the light-shielding layer and the protective layer contains a hydrophilic material and the other of the light-shielding layer and the protective layer contains a hydrophobic material,
the light-shielding layer comprising a first light-shielding portion that is located on a surface of the array layer facing the first light-emitting elements and located between adjacent two of the first light-emitting elements,
wherein at least one of the first light-emitting elements comprises a first surface facing away from the array layer, and
wherein the protective layer comprises a first protective portion located in at least a partial region of the first surface.

2. The display panel according to claim 1, wherein:
the first protective portion is located at an edge of the first surface; and
the first protective portion forms a closed ring structure along the edge of the first surface.

3. The display panel according to claim 1, wherein the first protective portion is located on the entire first surface.

4. The display panel according to claim 3, wherein:
the first light-emitting elements comprise a first color light-emitting element and a second color light-emitting element, and an emission wavelength of the first color light-emitting element is smaller than an emission wavelength of the second color light-emitting element;
the first protective portion comprises a first protective sub-portion corresponding to the first color light-emitting element, and a second protective sub-portion corresponding to the second color light-emitting element; and
the first protective sub-portion has an orthographic projection area of S1 along a first direction, and the second protective sub-portion has an orthographic projection area of S2 along the first direction, wherein S2>S1, and the first direction is perpendicular to a plane of the display panel.

5. The display panel according to claim 1, wherein the protective layer further comprises a second protective portion, at least one of the first light-emitting elements further comprises a first side surface in contact with the first surface, and the second protective portion is located on the first side surface.

6. The display panel according to claim 5, wherein
at least one of the first light-emitting elements comprises a first electrode, a second electrode, a first contact layer, a light-emitting layer, and a second contact layer, wherein the first contact layer, the light-emitting layer, and the second contact layer are sequentially laminated;
the light-emitting layer is located between the first contact layer and the second contact layer;
the first electrode is electrically connected to the first contact layer, and the second electrode is electrically connected to the second contact layer;
the first electrode and the second electrode are located at a side of the light-emitting layer adjacent to the array layer along a first direction;
the first direction is perpendicular to the plane of the display panel; and
the second protective portion has a height of H1 along the first direction, the first protective portion has a height of H01, and the second contact layer has a height of H02, wherein H1≥H01+H02.

7. The display panel according to claim 6, wherein a minimum distance between the second protective portion and the array layer is greater than a maximum distance between the first electrode or second electrode and the array layer along the first direction.

8. The display panel according to claim 6, wherein:

the protective layer further comprises third protective portions;

at least one of the first light-emitting elements further comprises a second side surface opposite to the first side surface; the third protective portion is located on the second side surface; and wherein, along the first direction, a minimum distance between the second protective portion and the array layer is equal to a minimum distance between the third protective portion and the array layer.

9. The display panel according to claim 6, wherein:

the light-shielding layer further comprises second light-shielding portions;

the second light-shielding portion is located on the first side surface; and wherein, along the first direction, the second light-shielding portion is in direct contact with the second protective portion.

10. The display panel according to claim 6, wherein:

the light-shielding layer further comprises a second light-shielding portion that is located on the first side surface; and the second protective portion has a height of H1;

the first light-shielding portion has a height of D1 along the first direction; and the second light-shielding portion has a height of D2, wherein H1>D2≥D1.

11. The display panel according to claim 5, wherein:

the first light-emitting elements comprise a first color light-emitting element and a second color light-emitting element, and an emission wavelength of the first color light-emitting element is smaller than an emission wavelength of the second color light-emitting element;

the first protective portion comprises a first sub-portion corresponding to the first color light-emitting element, and a second sub-portion corresponding to the second color light-emitting element;

the second protective portion comprises a third sub-portion corresponding to the first color light-emitting element, and a fourth sub-portion corresponding to the second color light-emitting element;

the first sub-portion has a height of h01, the second sub-portion has a height of h02, the third sub-portion has a height of h03, and the fourth sub-portion has a height of h04 along a first direction, and the first direction is perpendicular to a plane of the display panel, wherein h03−h01<h04−h02.

12. The display panel according to claim 11, wherein:

the first color light-emitting element has a height of H2, and the second color light-emitting element has a height of H3 along the first direction, wherein (h03−h01)/H2<(h04−h02)/H3.

13. The display panel according to claim 5, wherein:

the first light-emitting elements comprise a first color light-emitting element and a second color light-emitting element, and an emission wavelength of the first color light-emitting element is smaller than an emission wavelength of the second color light-emitting element;

the second protective portion comprises a third sub-portion corresponding to the first color light-emitting element, and a fourth sub-portion corresponding to the second color light-emitting element;

the third sub-portion has a height of h03, and the fourth sub-portion has a height of h04 along a first direction;

a distance from the array layer to a surface of the first color light-emitting element that is away from the array layer and a distance from the array layer to a surface of the second color light-emitting element that is away from the array layer are different, wherein h03≠h04.

14. The display panel according to claim 1, further comprising a packaging layer, wherein the packaging layer is located at a side of the protective layer facing away from the array layer, and the packaging layer has a refractive index of n0;

the first light-emitting elements comprise a first color light-emitting element and a second color light-emitting element, and an emission wavelength of the first color light-emitting element is smaller than an emission wavelength of the second color light-emitting element;

the first protective portion comprises a first sub-portion corresponding to the first color light-emitting element, and a second sub-portion corresponding to the second color light-emitting element; and the first sub-portion has a refractive index of n1, and the second sub-portion has a refractive index of n2, wherein n1<n2<n0.

15. The display panel according to claim 1, further comprising a second display region and a second light-emitting element located in the second display region, wherein the first display region at least partially surrounds the second display region, and the protective layer comprises a fourth protective portion that is located in the second display region and at least located between adjacent second light-emitting elements.

16. The display panel according to claim 15, wherein:

The second display region comprises a transparent heightening portion located between adjacent two of the second light-emitting elements;

a surface of the transparent heightening portion away from the array layer is flush with a surface of the second light-emitting element facing away from the array layer; and the fourth protective portion is located on the surface of the transparent heightening portion facing away from the array layer and the surface of the second light-emitting element facing away from the array layer.

17. The display panel according to claim 1, wherein:

the first display region comprises a first display sub-region and a second display sub-region, the first display sub-region at least partially surrounding the second display sub-region;

the protective layer further comprises a second protective portion, at least one of the first light-emitting elements further comprises a first side surface in contact with the first surface, and the second protective portion is located on the first side surface;

the first protective portion comprises a first sub-portion corresponding to one of the first light-emitting elements in the first display sub-region and a second sub-portion corresponding to at least one of the first light-emitting elements in the second display sub-region;

the second protective portion comprises a third sub-portion corresponding to one of the first light-emitting elements in the first display sub-region and a fourth sub-portion corresponding to one of the first light-emitting elements in the second display sub-region; and the first sub-portion has a height of h11, the second sub-portion has a height of h12, the third sub-portion has a height of h13, the fourth sub-portion has a height of h14 along a first direction, and first direction is perpendicular to a plane of the display panel, wherein h13–h11>h14–h12.

18. The display panel according to claim 17, wherein:

the first display region further comprises a third display sub-region that is located between the first display sub-region and the second display sub-region;

the first protective portion comprises a fifth sub-portion corresponding to one of the first light-emitting elements in the third display sub-region;

the second protective portion comprises a sixth sub-portion corresponding to one of the first light-emitting elements in the third display sub-region; and the fifth sub-portion has a height of h15, and the sixth sub-portion has a height of h16 along the first direction, wherein (h13–h11)–(h16–h15)>(h16–15)–(h14–h12) >0.

19. The display panel according to claim 1, further comprising a blocking portion located between the array layer and the first light-shielding portion, wherein one of the blocking portion and the protective layer contains a hydrophilic material, while the other of the blocking portion and the protective layer contains a hydrophobic material.

20. A display apparatus, comprising a display panel, wherein:

the display panel, comprises a first display region, an array layer, first light-emitting elements, a light-shielding layer and a protective layer, wherein the first light-emitting elements are located in the first display region and electrically connected to the array layer;

wherein one of the light-shielding layer and the protective layer contains a hydrophilic material and the other of the light-shielding layer and the protective layer contains a hydrophobic material;

the light-shielding layer comprises a first light-shielding portion that is located on a surface of the array layer facing the first light-emitting elements and located between adjacent two of the first light-emitting elements; and wherein at least one of the first light-emitting elements comprises a first surface facing away from the array layer, and the protective layer comprises a first protective portion located in at least a partial region of the first surface.

* * * * *